(12) United States Patent
Wang et al.

(10) Patent No.: US 11,961,808 B2
(45) Date of Patent: Apr. 16, 2024

(54) ELECTRONIC PACKAGE STRUCTURE WITH REINFORCEMENT ELEMENT

(71) Applicant: Advanced Semiconductor Engineering, Inc., Kaohsiung (TW)

(72) Inventors: Wei-Jen Wang, Kaohsiung (TW); Po-Jen Cheng, Kaohsiung (TW); Fu-Yuan Chen, Kaohsiung (TW); Yi-Hsin Cheng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 196 days.

(21) Appl. No.: 17/501,953

(22) Filed: Oct. 14, 2021

(65) Prior Publication Data

US 2023/0124000 A1    Apr. 20, 2023

(51) Int. Cl.
*H01L 23/498* (2006.01)
*H01L 23/00* (2006.01)
*H01L 23/538* (2006.01)

(52) U.S. Cl.
CPC ...... *H01L 23/562* (2013.01); *H01L 23/49811* (2013.01); *H01L 23/5386* (2013.01); *H01L 24/14* (2013.01)

(58) Field of Classification Search
CPC ........... H01L 23/49822; H01L 23/5383; H01L 2224/02331; H01L 2224/0239; H01L 2224/024; H01L 23/562; H01L 2924/3511; H05K 3/4688; H05K 3/4691; H05K 1/0271; H05K 2201/09136; H05K 2201/099
See application file for complete search history.

(56) References Cited

U.S. PATENT DOCUMENTS

| | | | |
|---|---|---|---|
| 10,269,778 B2 | 4/2019 | Lin et al. | |
| 11,616,051 B2 * | 3/2023 | Kim | H01L 25/50 257/668 |
| 2015/0041987 A1 * | 2/2015 | Yew | H01L 23/562 257/774 |
| 2017/0170130 A1 * | 6/2017 | Kaneda | H01L 25/105 |
| 2018/0261556 A1 * | 9/2018 | Haba | H01L 23/49811 |
| 2020/0294914 A1 * | 9/2020 | Agarwal | H01L 25/0655 |
| 2021/0202336 A1 | 7/2021 | Chang et al. | |
| 2023/0050785 A1 * | 2/2023 | Yeh | H01L 21/6835 |

* cited by examiner

*Primary Examiner* — Marcos D. Pizarro
*Assistant Examiner* — William H Anderson
(74) *Attorney, Agent, or Firm* — FOLEY & LARDNER LLP

(57) ABSTRACT

At least some embodiments of the present disclosure relate to an electronic package structure. The electronic package structure includes an electronic structure, a wiring structure disposed over the electronic structure, a bonding element connecting the wiring structure and the electronic structure, and a reinforcement element attached to the wiring structure. An elevation difference between a highest point and a lowest point of a surface of the wiring structure facing the electronic structure is less than a height of the bonding element.

8 Claims, 38 Drawing Sheets

ELECTRONIC PACKAGE STRUCTURE WITH REINFORCEMENT ELEMENT

BACKGROUND

1. Technical Field

The present disclosure relates to an electronic package structure. More particularly, the present disclosure relates to an electronic package structure including a reinforcement element.

2. Description of the Related Art

In a Fan-Out Package on Package (FO-POP), to meet the requirements of a lower profile, a top substrate and a bottom substrate of the POP may be replaced with redistribution layers (RDLs) so as to decrease a thickness of the POP.

However, since a top RDL is relatively thin, it may be broken when bonded to a bottom RDL of the POP. In addition, warpage of the POP may occur when the thickness of the POP is decreased.

SUMMARY

In some embodiments, according to one aspect, an electronic package structure includes an electronic structure, a wiring structure disposed over the electronic structure, a bonding element connecting the wiring structure and the electronic structure, and a reinforcement element attached to the wiring structure. An elevation difference between a highest point and a lowest point of a surface of the wiring structure facing the electronic structure is less than a height of the bonding element.

In some embodiments, according to another aspect, an electronic package structure includes an electronic structure, a wiring structure disposed over the electronic structure, a bonding element connecting the wiring structure and the electronic structure, and a reinforcement element attached to the wiring structure. A space between the electronic structure and wiring structure includes a first gap and a second gap different from the first gap In some embodiments, according to another aspect, an electronic package structure includes an electronic structure, a wiring structure disposed over the electronic structure, and a reinforcement element attached to the wiring structure. A first warpage of the electronic structure is greater than a second warpage of the wiring structure.

DETAILED DESCRIPTION

Figure 1A:
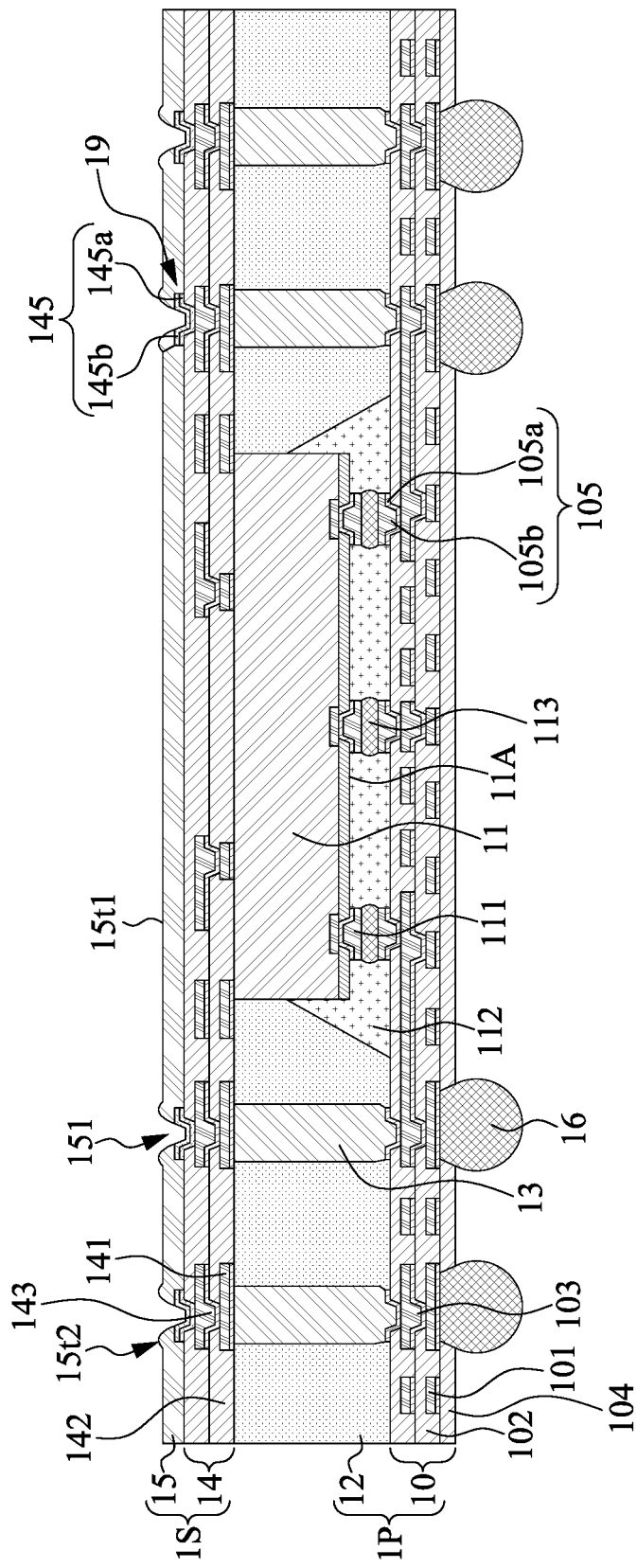
FIG. 1A illustrates a cross-sectional view of an electronic package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of the embodiments of this disclosure are not deviated from by such arrangement.

FIG. 1A is a cross-sectional view of an electronic package structure 1 in accordance with some embodiments of the present disclosure. The electronic package structure 1 includes an electronic structure 1P, a substrate 1S disposed on a top surface of the electronic structure 1P, and an electrical connector 16 disposed on a bottom surface of the electronic structure 1P. A lateral surface of the substrate 1S and a lateral surface of the electronic structure 1P are substantially coplanar.

The electronic structure 1P includes a circuit structure 10, an electronic device 11, an underfill 112, an encapsulant 12, and a conductive element 13. In some embodiments, the electronic structure 1P may include a package or a substrate.

The circuit structure 10 includes at least one circuit layer 101, at least one dielectric layer 102 in contact with the circuit layer 101, and at least one conductive pad 105 disposed on and in contact with the circuit layer 101 and the dielectric layer 102. The dielectric layer 102 may be made of a cured photoimageable dielectric (PID) material such as epoxy or polyimide (PI) including photoinitiators. The circuit layer 101 may include a seed layer and a conductive metallic material disposed on the seed layer. The circuit layer 101 may be a fan-out circuit layer or a redistribution layer (RDL). The conductive pad 105 may include a seed layer 105a and a conductive metallic material 105b disposed on the seed layer 105a. The conductive pad 105 protrudes from and extends on the dielectric layer 102.

The circuit structure 10 includes a plurality of circuit layers 101, a plurality of dielectric layers 102, a plurality of inner vias 103, a dielectric layer 104, and a plurality of conductive pads 105. The dielectric layer 104 is disposed on a bottom surface of the dielectric layer 102. The electrical connectors 16 (e.g., solder ball) is surrounded by the dielectric layer 104. In some embodiments, the dielectric layer 104 may be a solder resist layer. The dielectric layer 104 may be omitted. The circuit structure 10 may be a redistribution layer (RDL) structure.

The inner vias 103 are disposed between two adjacent circuit layers 101 for electrically connecting the circuit layer 101 to the conductive pad 105 or the seed layer 105b. Each of the inner vias 103 may include a seed layer and a conductive metallic material disposed on the seed layer. Each of the inner vias 103 tapers downwardly along a direction from the top surface towards the bottom surface of the circuit structure 10.

The electronic device 11 is disposed on the circuit structure 10. The electronic device 11 has an active surface 11A. The electronic device 11 includes a conductive post 111 disposed adjacent to the active surface 11A. The conductive post 111 is electrically connected to the conductive pad 105 through an internal connector 113 (e.g., a solder material). The electronic device 11 is electrically connected to the conductive pad 105 of the circuit structure 10 through the internal connector 113 by flip-chip bonding. In some embodiments, the electronic device 11 may include an application-specific integrated circuit (ASIC), a controller, a processor or another electronic component or semiconductor device. The underfill 112 is disposed in the space between the electronic device 11 and the circuit structure 10 to cover and protect the conductive pad 105, the internal connector 113 and the conductive post 111.

The conductive element 13 is disposed on the circuit structure 10 and electrically connected to the circuit structure 10. The conductive element 13 is in contact with the seed layer 105b. The conductive element 13 may be a copper pillar and may be disposed around the electronic device 11.

The encapsulant 12 is disposed on the circuit structure 10. In some embodiments, the encapsulant 12 may be a molding compound with or without fillers. The encapsulant 12 encapsulates the electronic device 11, the underfill 112 and the conductive element 13. A top surface of the electronic device 11, a top surface of the encapsulant 12, and a top surface of the conductive element 13 are substantially coplanar. The conductive element 13 extends through the encapsulant 12. The conductive element 13 penetrates the encapsulant 12.

The substrate 1S includes an RDL structure 14 and a reinforcement element 15. The substrate 1S include an electrical contact 19. The substrate 1S is electrically connected to the electronic structure 1P. The RDL structure 14 of the substrate 1S is in contact with the electronic structure 1P. The RDL structure 14 is a wiring structure. The wiring structure 14 is disposed over the electronic structure 1P.

The RDL structure 14 includes at least one circuit layer 141, at least one dielectric layer 142 in contact with the circuit layer 141, and at least one under bump metallurgy (UBM) layer 145 disposed on and in contact with the circuit layer 141 and the dielectric layer 142. The dielectric layer 142 may be made of a cured photoimageable dielectric (PID) material such as epoxy or polyimide (PI) including photoinitiators. The circuit layer 141 may include a seed layer and a conductive metallic material disposed on the seed layer. The circuit layer 141 may be a fan-out circuit layer or a redistribution layer (RDL). The UBM layer 145 may include a seed layer 145a and a conductive metallic material 145b disposed on the seed layer 145a. The conductive metallic material 145b may include a nickel layer and/or a gold layer. The UBM layer 145 protrudes from and extends on the dielectric layer 142. In some embodiments, the RDL structure 14 may be formed or may be built up on the electronic structure 1P. Thus, the RDL structure 14 may contact the top surface of the electronic structure 1P directly. The UBM layers 145 may be the electrical contacts 19.

The RDL structure 14 includes a plurality of circuit layers 141, a plurality of dielectric layers 142, a plurality of inner vias 143, and a plurality of UBM layers 145. The plurality of UBM layers 145 define an electronic device mounting area.

The inner vias 143 are disposed between two adjacent circuit layers 141 for electrically connecting the circuit layers 141 to the UBM layer 145. Each of the inner vias 143 may include a seed layer and a conductive metallic material disposed on the seed layer. Each of the inner vias 143 tapers downwardly along a direction from the top surface towards the bottom surface of the RDL structure 14.

In some embodiments, a thickness of the RDL structure 14 is less than a thickness of the circuit structure 10. The thickness of the RDL structure 14 may be in a range from around 20 μm to around 30 μm. The thickness of the circuit structure 10 may be in a range from around 30 μm to around 45 μm. A number of I/O pins of the RDL structure 14 is less than a number of I/O pins of the circuit structure 10. A line space/line width (L/S) of the RDL structure 14 is less than an L/S of the circuit structure 10.

The reinforcement element 15 is disposed on and in contact with the RDL structure 14. The reinforcement element 15 is bonded and attached to the RDL structure 14. The reinforcement element 15 defines an opening 151 to expose the UBM layer 145 (e.g., the electrical contact 19) for external connection. The reinforcement element 15 has a top surface with a planar portion 15t1 and a portion 15t2. The portion 15t2 is adjacent to the opening 151. For example, the portion 15t2 may define the opening 151. The portion 15t2 surrounding the opening 151 is conformal with the UBM layer 145 and a top surface of the RDL structure 14. The portion 15t2 includes a curved shape. Such design of the reinforcement element 15 may facilitate mounting an additional electronic device on it. In some embodiments, the reinforcement element 15 may be formed from a film type material that is attached or adhered to the top surface of the RDL structure 14. Thus, a portion of the portion 15t2 that is on the UBM layer 145 may protrude from the planar portion 15t1.

A rigidity of the reinforcement element 15 is greater than a rigidity of the RDL structure 14. A hardness of the reinforcement element 15 is greater than a hardness of the RDL structure 14. A coefficient of thermal conductivity of the reinforcement element 15 is greater than a coefficient of thermal conductivity of the RDL structure 14. A coefficient of thermal expansion (CTE) of the reinforcement element 15 is less than or substantially equal to a CTE of the RDL structure 14. The CTE and a modulus of the reinforcement element 15 are greater than a CTE and a modulus of the encapsulant 12. The encapsulant 12 of the electronic structure 1P has a first CTE substantially equal to a second CTE of the reinforcement element 15. A thickness of the reinforcement element 15 may be in a range from around 30 μm to around 50 μm. The thickness of the reinforcement element 15 is less than a thickness of the encapsulant 12. The thickness of the reinforcement element 15 is greater than a thickness of the RDL structure 14. In some embodiments, the reinforcement element 15 may include a molding compound, an epoxy resin, or other suitable materials. The reinforcement element 15 may include a film type molding compound. The reinforcement element 15 may include fillers. A material of the encapsulant 12 of the electronic structure 1P may be same as a material of the reinforcement element 15. The CTE of the reinforcement element 15 may be adjusted by a number of the fillers. The arrangement of the reinforcement element 15 may reduce warpage of the electronic package structure 1. In some embodiments, the reinforcement element 15 is configured to reduce a warpage of the electronic structure 1P and/or the RDL structure 14.

Figure 1B:
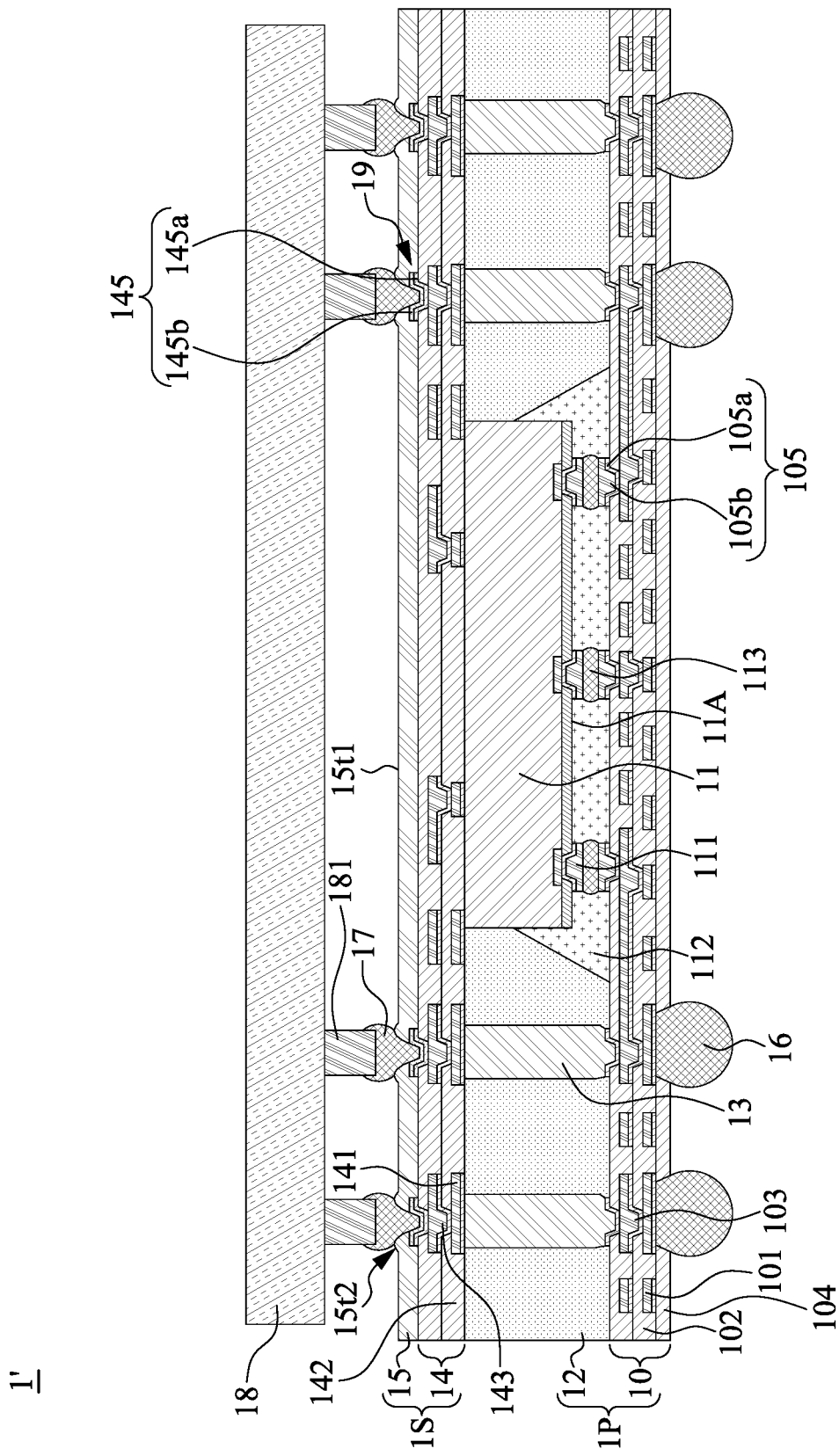
FIG. 1B illustrates a cross-sectional view of an electronic package structure according to some embodiments of the present disclosure.

FIG. 1B is a cross-sectional view of an electronic package structure 1' in accordance with some embodiments of the present disclosure. The electronic package structure 1' is similar to the electronic package structure 1 in FIG. 1A except that an electronic device 18 is disposed on the substrate 1S.

The electronic device 18 includes a conductive post 181. The electronic device 18 is electrically connected to the UBM layer 145 (e.g., the electrical contact 19) through a conductor 17. The electronic device 18 may be disposed in the electronic device mounting area defined by the UBM layers 145. The conductor 17 is disposed within the opening 151 of the reinforcement element 15. In some embodiments, the electronic device 18 is a memory device such as a high bandwidth memory (HBM) die. The conductor 17 is a solder. The number of I/O pins of the RDL structure 14 is suitable for the arrangement of the electronic device 18. The electronic device 18 is electrically communicated with the electronic device 11 through the RDL structure 14, the conductive element 13 and the circuit structure 10.

The electronic device 18 is electrically connected to the electronic structure 1P through the substrate 1S. The substrate 1S includes the RDL structure 14 and the reinforcement element 15 between the redistribution layer RDL structure 14 and the electronic device 18.

The conductor 17 is disposed on the portion 15t2 of the top surface of the reinforcement element 15. The conductor 17 may be easily disposed or held into the opening 151. The conductor 17 may include, but is not limited to, solder conductors such as solder balls, solder bumps or solder pastes.

Figure 1C:
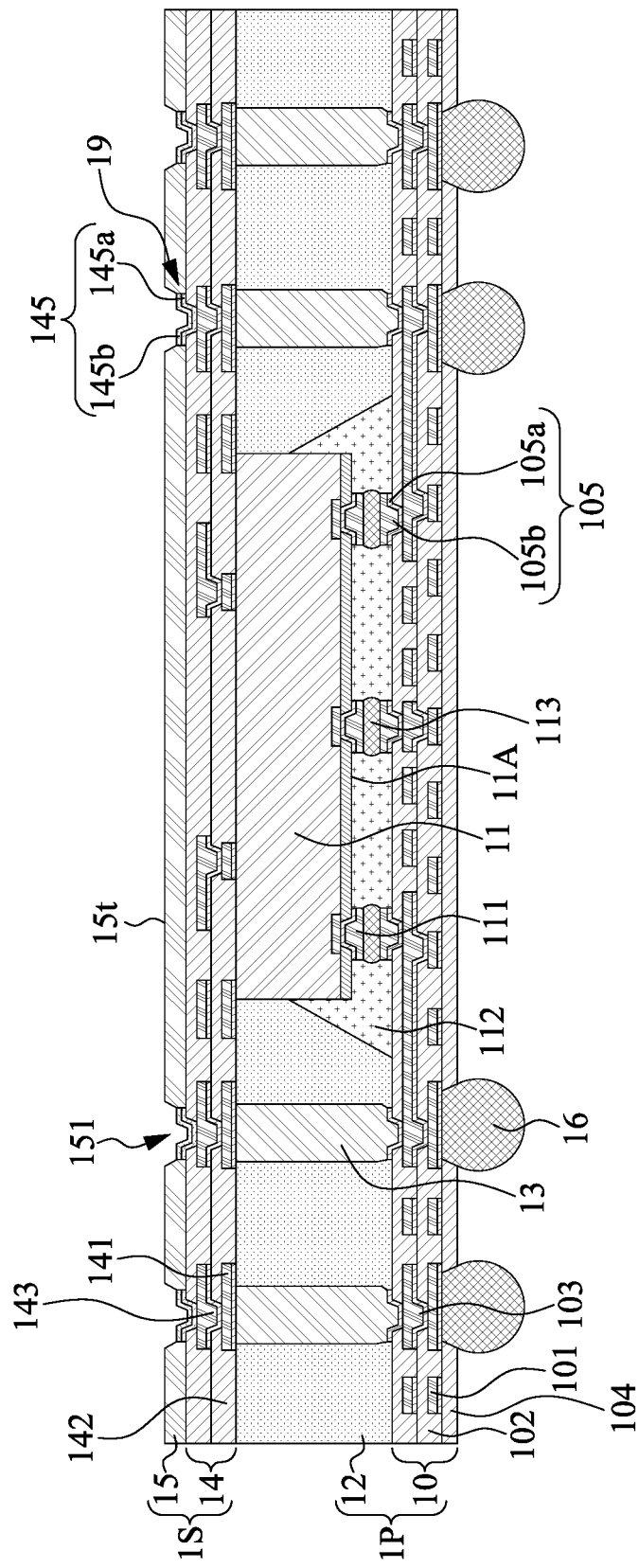
FIG. 1C illustrates a cross-sectional view of an electronic package structure according to some embodiments of the present disclosure.

FIG. 1C is a cross-sectional view of an electronic package structure 1" in accordance with some embodiments of the present disclosure. The electronic package structure 1" is similar to the electronic package structure 1 in FIG. 1A except that the UBM layer 145 is completely exposed from the reinforcement element 15. Such arrangement may avoid cold joint effect during manufacturing operations.

Figure 2A:
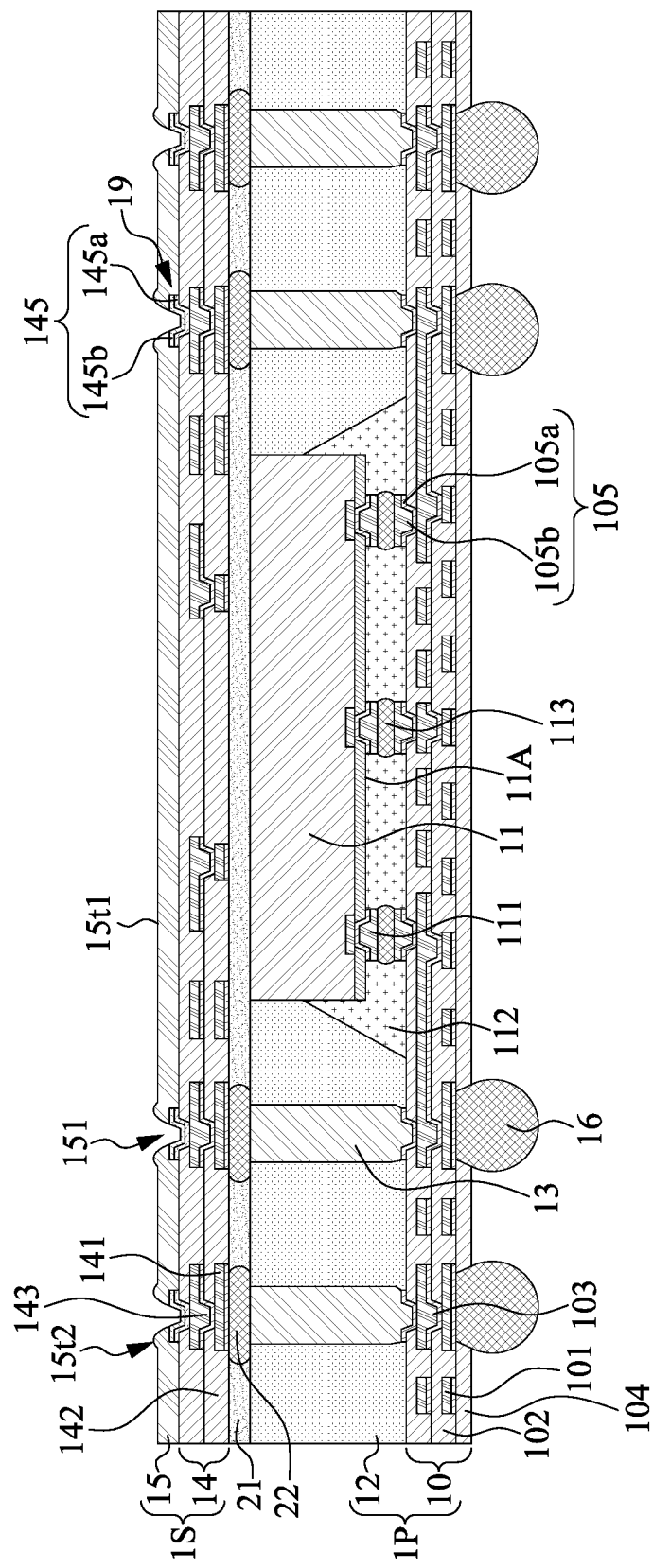
FIG. 2A illustrates a cross-sectional view of an electronic package structure according to some embodiments of the present disclosure.

FIG. 2A is a cross-sectional view of an electronic package structure 2 in accordance with some embodiments of the present disclosure. The electronic package structure 2 is similar to the electronic package structure 1 in FIG. 1A except that an underfill 21 is disposed between the substrate 1S and the electronic structure 1P and that the substrate 1S is electrically connected to the electronic structure 1P through a reflowable material/bonding element 22. Thus, the bonding element 22 connects the wiring structure 14 and the electronic structure 1P. The reflowable material 22 may include a solder ball, a solder bump or a solder paste. The reflowable material 22 may act as a bonding element. The reflowable material 22 is disposed on the conductive element 13 and contacts the bottommost circuit layer 141 of the RDL structure 14. In some embodiments, the substrate 1S is attached to or bonded to the electronic structure 1P through a thermo-compression bonding technique, thus, the reflowable material 22 may be squashed in a disk shape. The reflowable material 22 may cover and contact a portion of the bottommost dielectric layer 142 of the RDL structure 14. Further, the reflowable material 22 may cover and contact a portion of the encapsulant 12. A minimum width of the reflowable material 22 may be greater than a width of the conductive element 13. There may be an interference or a boundary between the reflowable material 22 and the encapsulant 12. A width of a region that the reflowable material 22 contacts the encapsulant 12 may be greater than the width of the conductive element 13.

The reflowable material 22 is encapsulated by the underfill 21. A lateral surface of the substrate 1S, a lateral surface of the electronic structure 1P, and a lateral surface of the underfill 21 are substantially coplanar with each other. The arrangement of the underfill 21 may further reduce warpage of the electronic package structure 2. In some embodiments, a material of the underfill 21 may be the same as or different from a material of the underfill 112. The material of the underfill 21 may be different from a material of the encapsulant 12. The bonding element 22 and the reinforcement layer 15 are disposed adjacent to two opposite sides (opposite surfaces such as a top surface and a bottom surface) of the wiring structure 14, respectively.

In the illustrated embodiment, the reinforcement element 15 may facilitate a thermo-compression head to handle the thin RDL structure 14 or the substrate 1S. The reinforcement element 15 is configured to ensure a joint between the reflowable material/bonding element 22 and the RDL structure 14 and a joint between the reflowable material/bonding element 22 the package/conductive structure 1P. In a comparative embodiment without the reinforcement element 15, it is very difficult for the thermo-compression head to handle the thin RDL structure 14, and the thin RDL structure 14 may easily break during a compression process. To address such concern, the reinforcement element 15 of the illustrated embodiment may increase the total thickness of the substrate 1S such that the thermo-compression head may handle the relatively thick substrate 1S readily.

Figure 2B:
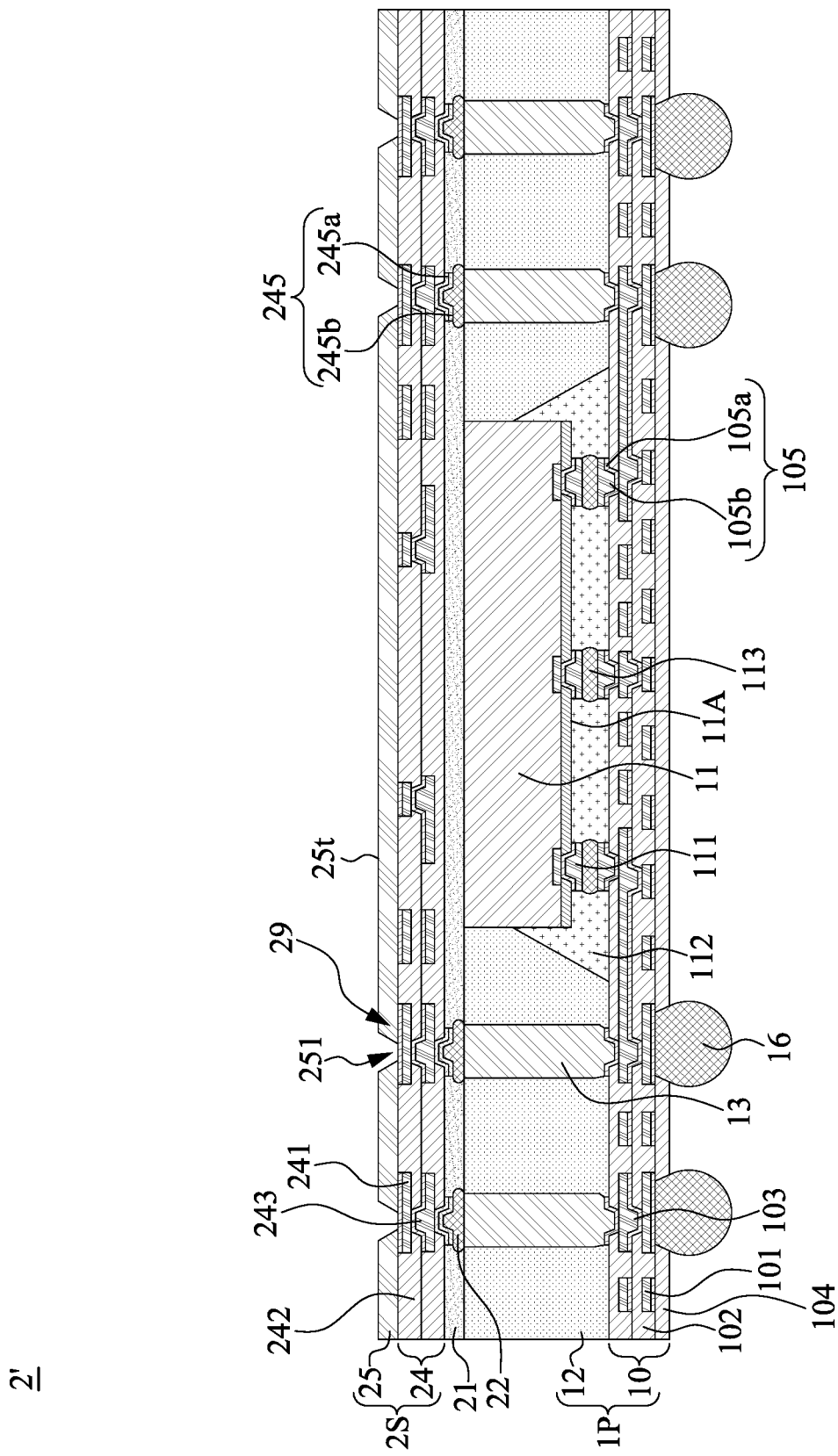
FIG. 2B illustrates a cross-sectional view of an electronic package structure according to some embodiments of the present disclosure.

FIG. 2B is a cross-sectional view of an electronic package structure 2' in accordance with some embodiments of the present disclosure. The electronic package structure 2' is similar to the electronic package structure 2 in FIG. 2A except that the substrate 1S of FIG. 2A is replaced by a substrate 2S of FIG. 2B.

The substrate 2S includes an RDL structure 24 and a reinforcement element 25. The substrate 2S is electrically connected to the package 2P through the reflowable material 22. The RDL structure 24 of the substrate 2S is in contact with the underfill 21. The substrate 2S includes electrical contacts 29.

The RDL structure 24 is similar to the RDL structure 14 in FIG. 2A except that the RDL structure 24 relates to a reverse type of the RDL structure 14. The RDL structure 24 includes at least one circuit layer 241, at least one dielectric layer 242 in contact with the circuit layer 241, and at least one UBM layer 245 disposed on and in contact with the circuit layer 241 and the dielectric layer 242. The UBM layer 245 may include a seed layer 245a and a conductive metallic material 245b disposed on the seed layer 245a. The conductive metallic material 245b may include a nickel layer and/or a gold layer. The UBM layer 245 is in contact with the reflowable material 22. The UBM layer 245 is in contact with the underfill 21. The UBM layer 245 is encapsulated by the underfill 21. The circuit layers 241 are exposed by the openings 251. The circuit layers 241 may be the electrical contacts 29. The circuit layers 241 may act as conductive pads.

The inner vias 243 are disposed between two adjacent circuit layers 241 for electrically connecting the circuit layers 241. Each of the inner vias 243 may include a seed layer and a conductive metallic material disposed on the seed layer. Each of the inner vias 243 tapers upwardly along a direction from the bottom surface towards the top surface of the RDL structure 24.

The reinforcement element 25 is disposed on the top surface of the RDL structure 24, and defines an opening 251 to expose the circuit layer 241. The reinforcement element 25 has a top surface 25t. The top surface 25t is substantially planar.

Figure 2C:
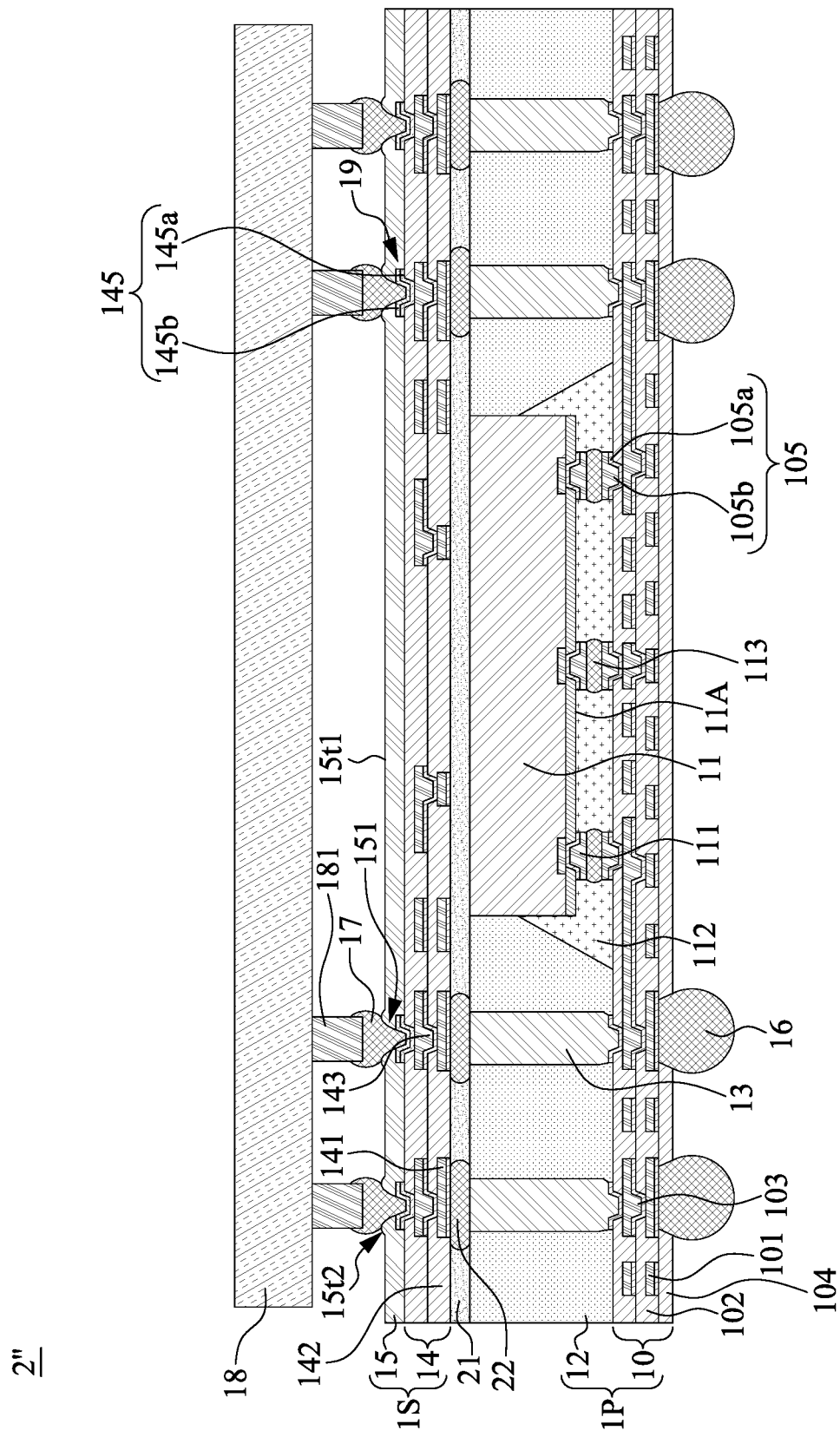
FIG. 2C illustrates a cross-sectional view of an electronic package structure according to some embodiments of the present disclosure.

FIG. 2C is a cross-sectional view of an electronic package structure 2" in accordance with some embodiments of the present disclosure. The electronic package structure 2" is similar to the electronic package structure 2 in FIG. 2A except that an electronic device 18 is disposed on the substrate 1S. The electronic device 18 may be a memory device such as a high bandwidth memory (HBM) die. The electronic device 18 includes a conductive post 181. The electronic device 18 is electrically connected to the UBM layer 145 through a conductor 17 disposed within the opening 151 of the reinforcement element 15. The electronic device 18 may be electrically communicated with the electronic device 11 through the RDL structure 14, the conductive element 13 and the circuit structure 10.

Figure 2D:
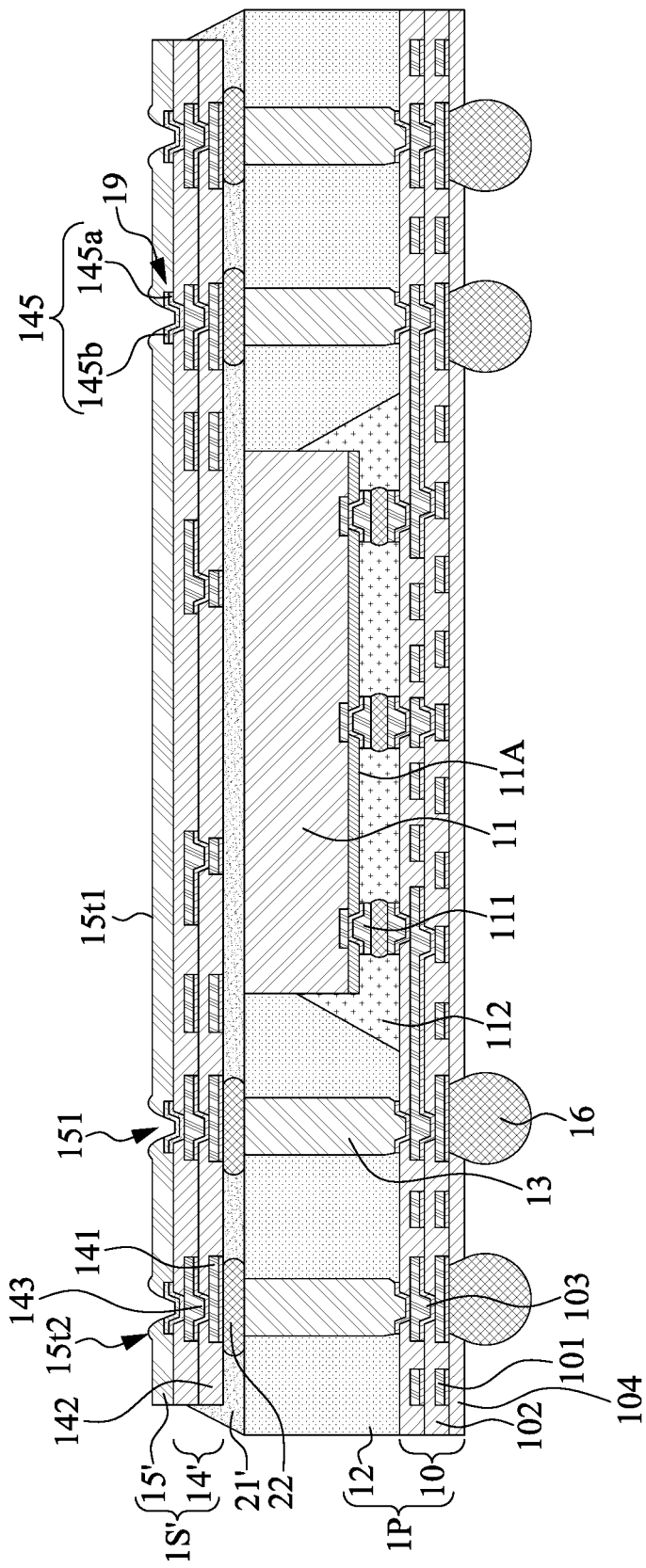
FIG. 2D illustrates a cross-sectional view of an electronic package structure according to some embodiments of the present disclosure.

FIG. 2D is a cross-sectional view of an electronic package structure 2''' in accordance with some embodiments of the present disclosure. The electronic package structure 2''' is similar to the electronic package structure 2 in FIG. 2A except that a width of a substrate 1S' is less than a width of the electronic structure 1P and that an underfill 21' partially covers a lateral surface of the substrate 1S'.

The substrate 1S' includes an RDL structure 14' and a reinforcement element 15'. The underfill 21' may extend to a lateral surface of the RDL structure 14'. The underfill 21' may extend to a lateral surface of the reinforcement element 15'. The substrate 1S' could be protected by the underfill 21'.

Figure 2E:
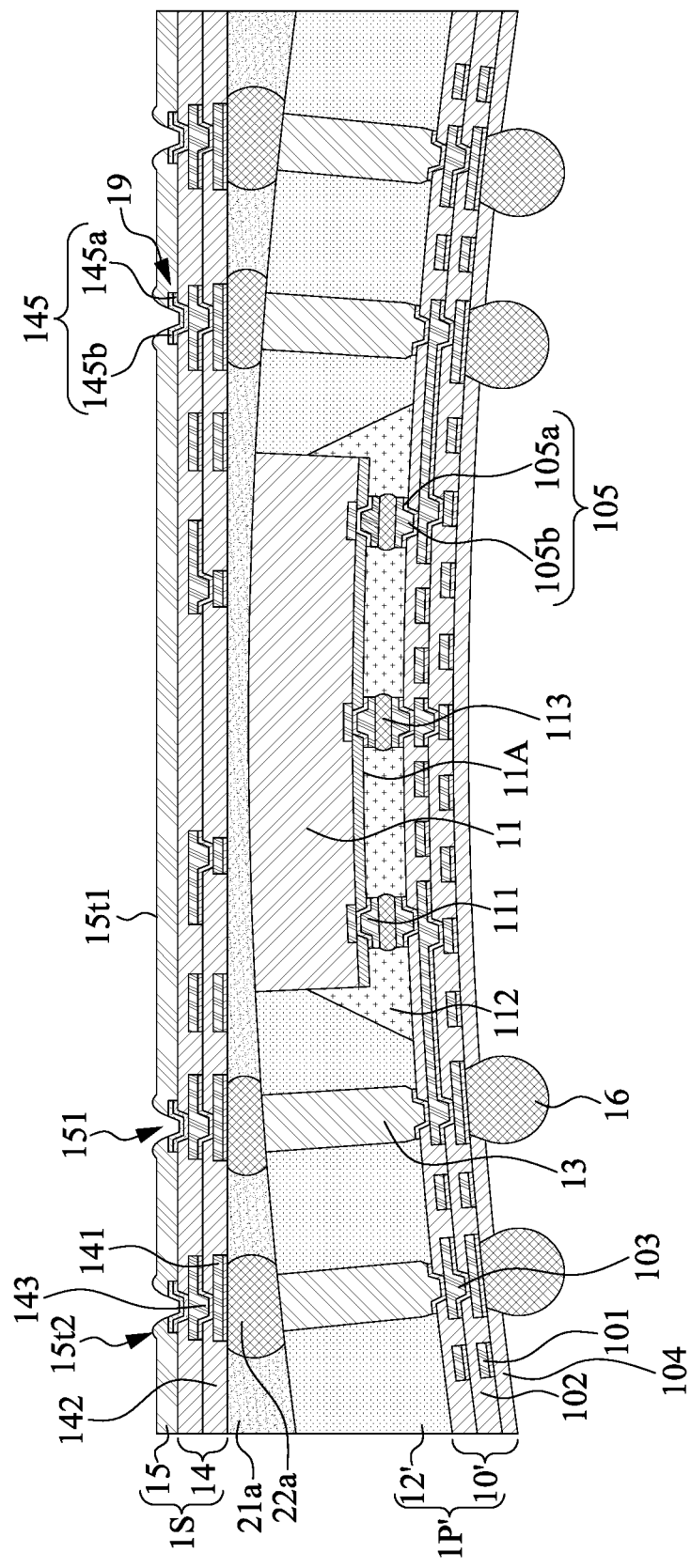
FIG. 2E illustrates a cross-sectional view of an electronic package structure according to some embodiments of the present disclosure.

FIG. 2E is a cross-sectional view of an electronic package structure 2a in accordance with some embodiments of the present disclosure. The electronic package structure 2a is similar to the electronic package structure 2 in FIG. 2A except that an electronic structure 1P' has a warpage and that a space between the substrate 1S and the electronic structure 1P' includes a first gap and a second gap which is less than the first gap. The first gap is closer to a lateral surface of the substrate 1S than the second gap is. An underfill 21a and a bonding element 22a are disposed in the space. The space is filled with the underfill 21a. The bonding element 22a is encapsulated by the underfill 21*a*. A width of the bonding element 22*a* is greater than a height of the bonding element 22*a*.

The electronic structure 1P' is configured to be inclined. A circuit structure 10' and an encapsulant 12' of the electronic structure 1P' are configured to be inclined. The electronic structure 1P' warps toward the RDL structure 14 of the substrate 1S. A central portion of the electronic structure 1P' is higher than a peripheral portion of the electronic structure 1P'. A lateral surface of the electronic structure 1P', a lateral surface of the substrate 1S' and a lateral surface of the underfill 21*a* are substantially coplanar with each other.

The reinforcement element 15 is configured to reduce a difference between the first gap and the second gap. The reinforcement element 15 is configured to flatten the electronic structure 1P', the substrate 1S' and/or the electronic package structure 2*a*.

Figure 2F:
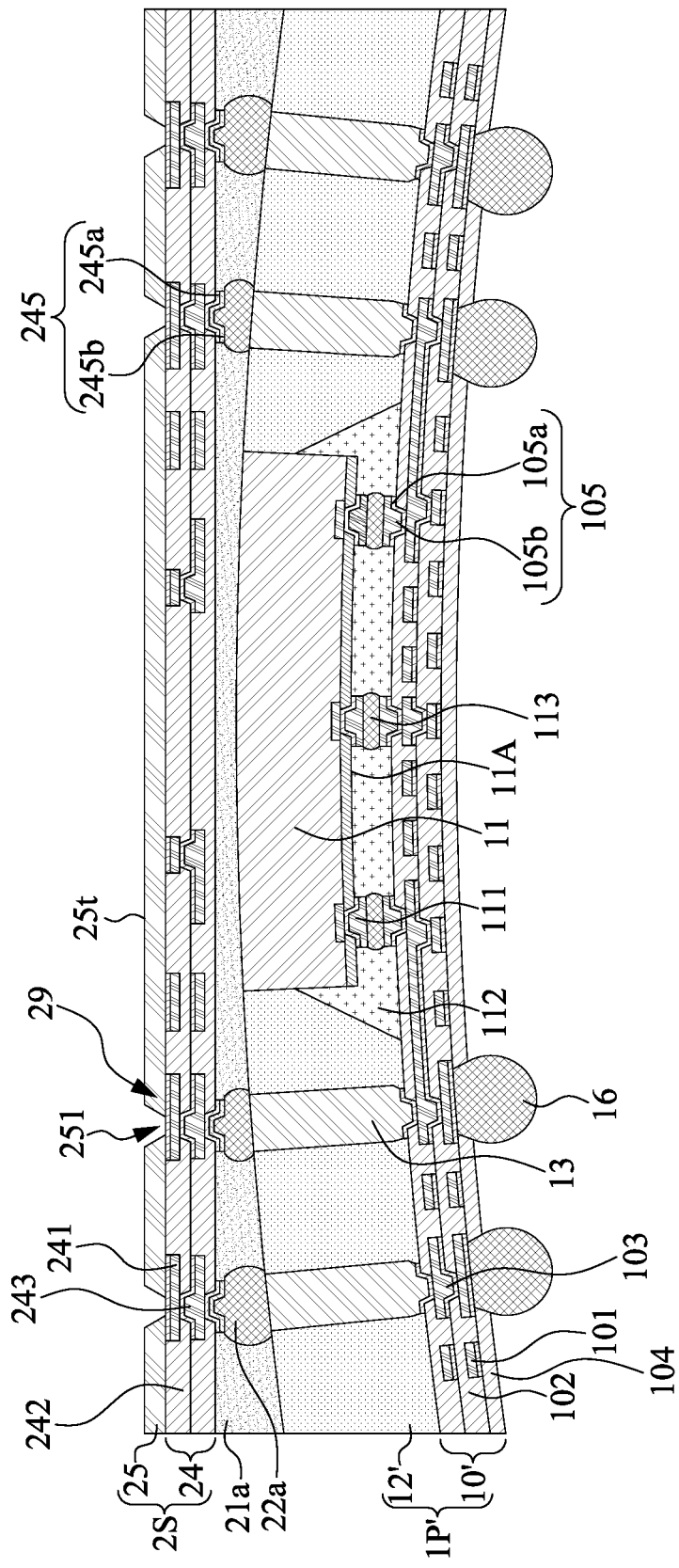
FIG. 2F illustrates a cross-sectional view of an electronic package structure according to some embodiments of the present disclosure.

FIG. 2F is a cross-sectional view of an electronic package structure 2'*a* in accordance with some embodiments of the present disclosure. The electronic package structure 2'*a* is similar to the electronic package structure 2' in FIG. 2B except that an electronic structure 1P' has a warpage and that a space between a substrate 2S and the electronic structure 1P' includes a first gap and a second gap which is less than the first gap. The first gap is closer to a lateral surface of the substrate 2S than the second gap is. An underfill 21*a* and a bonding element 22*a* are disposed in the space. The space is filled with the underfill 21*a*. The bonding element 22*a* is encapsulated by the underfill 21*a*. A width of the bonding element 22*a* is greater than a height of the bonding element 22*a*.

The electronic structure 1P' is configured to be inclined. The electronic structure 1P' warps toward the substrate 1S. A central portion of the electronic structure 1P' is higher than a peripheral portion of the electronic structure 1P'. A lateral surface of the electronic structure 1P', a lateral surface of the substrate 2S and a lateral surface of the underfill 21*a* are substantially coplanar with each other.

The reinforcement element 25 is configured to reduce a difference between the first gap and the second gap. The reinforcement element 25 is configured to flatten the electronic structure 1P'. The first gap is closer to a lateral surface of the substrate 2S than the second gap is. An underfill 21*a* and a bonding element 22*a* are disposed in the space. The space is filled with the underfill 21*a*. The bonding element 22*a* is encapsulated by the underfill 21*a*. A width of the bonding element 22*a* is greater than a height of the bonding element 22*a*.

Figure 2G:
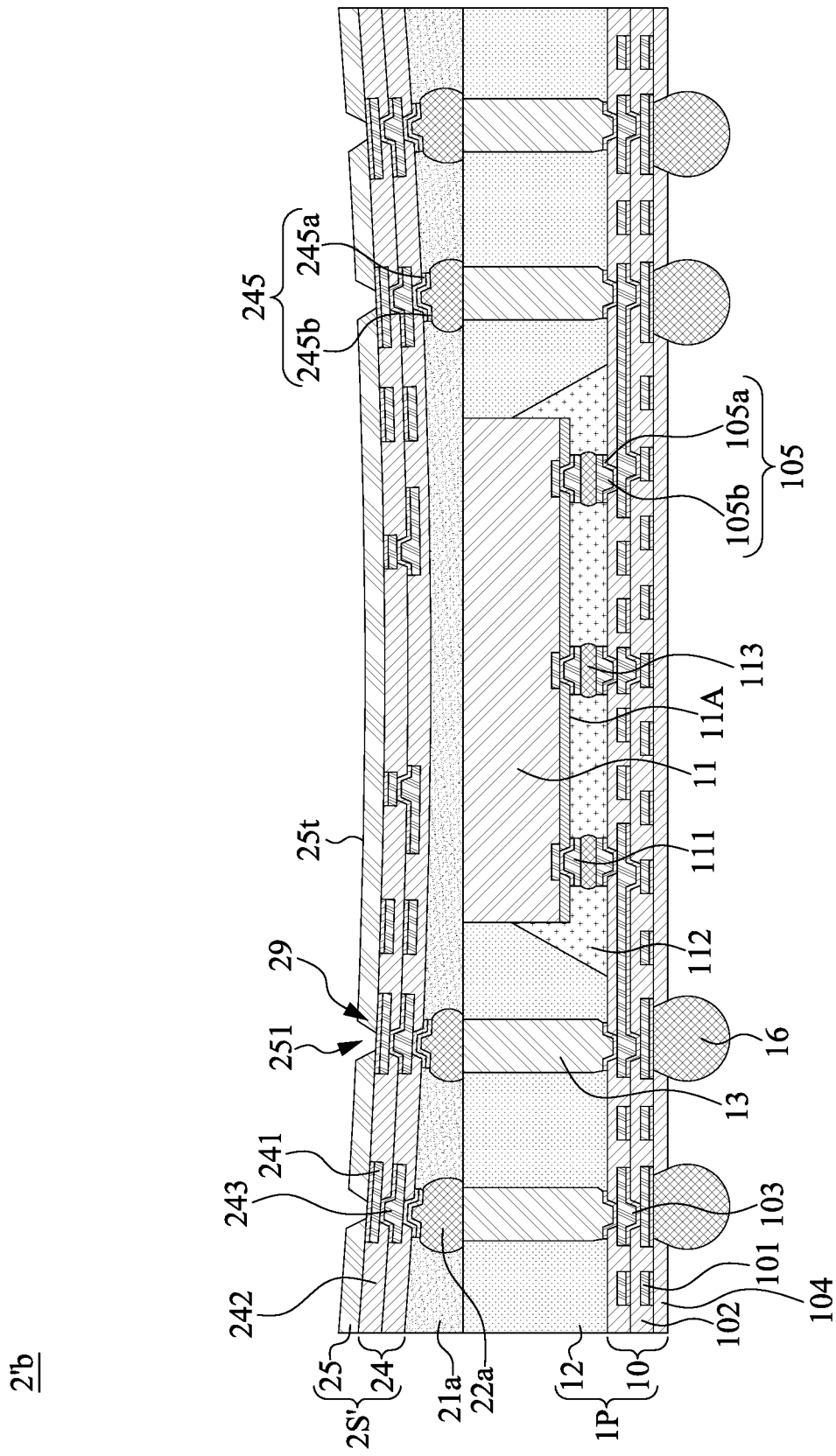
FIG. 2G illustrates a cross-sectional view of an electronic package structure according to some embodiments of the present disclosure.

FIG. 2G is a cross-sectional view of an electronic package structure 2'*b* in accordance with some embodiments of the present disclosure. The electronic package structure 2'*b* is similar to the electronic package structure 2' in FIG. 2B except that a substrate 2S' has a warpage and that a space between a substrate 2S' and the electronic structure 1P includes a first gap and a second gap which is less than the first gap.

The wiring structure 24 of the substrate 2S' is configured to be inclined. The wiring structure 24 of the substrate 2S' warps toward the electronic structure 1P. A central portion of the wiring structure 24 is lower than a peripheral portion of the wiring structure 24.

The reinforcement element 25 is configured to reduce a warpage of the wiring structure 24 to less than a height of the bonding element 22*a* so as to avoid a disconnection between the substrate 2S' and the electronic structure 1P. The reinforcement element 25 is configured to flatten the wiring structure 24.

Figure 2H:
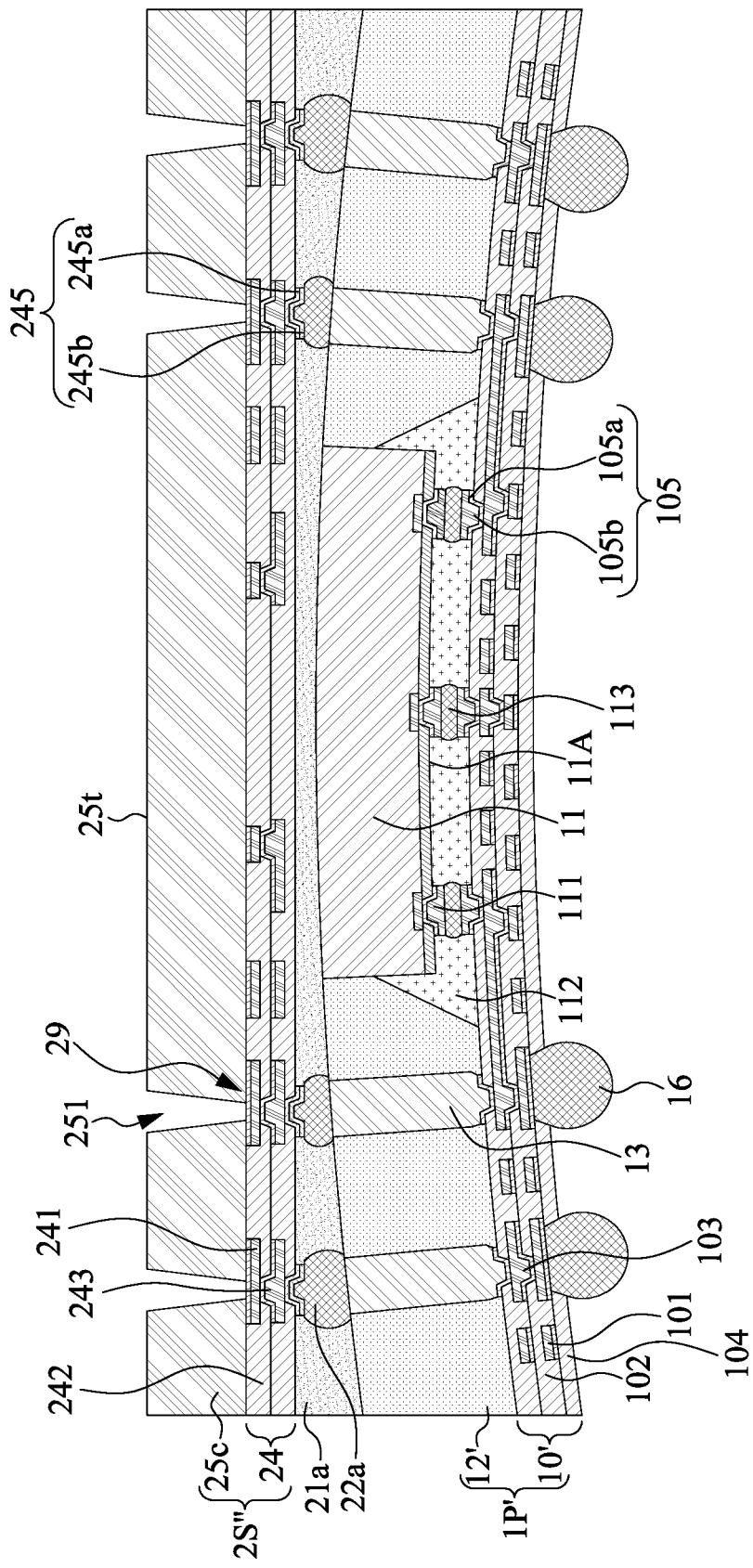
FIG. 2H illustrates a cross-sectional view of an electronic package structure according to some embodiments of the present disclosure.

FIG. 2H is a cross-sectional view of an electronic package structure 2'*c* in accordance with some embodiments of the present disclosure. The electronic package structure 2'*c* is similar to the electronic package structure 2'*a* in FIG. 2F except that a thickness of a reinforcement element 25*c* is greater than a thickness of the reinforcement element 25 of FIG. 2F. In some embodiments, the thickness of a reinforcement element 25*c* may be two, three, or four times as thick as the thickness of the reinforcement element 25 of FIG. 2F. The thickness of a reinforcement element 25*c* is greater than a thickness of the RDL structure 24.

The reinforcement element 25*c* is configured to flatten the electronic structure 1P' and/or the RDL structure 24 effectively.

Figure 2I:
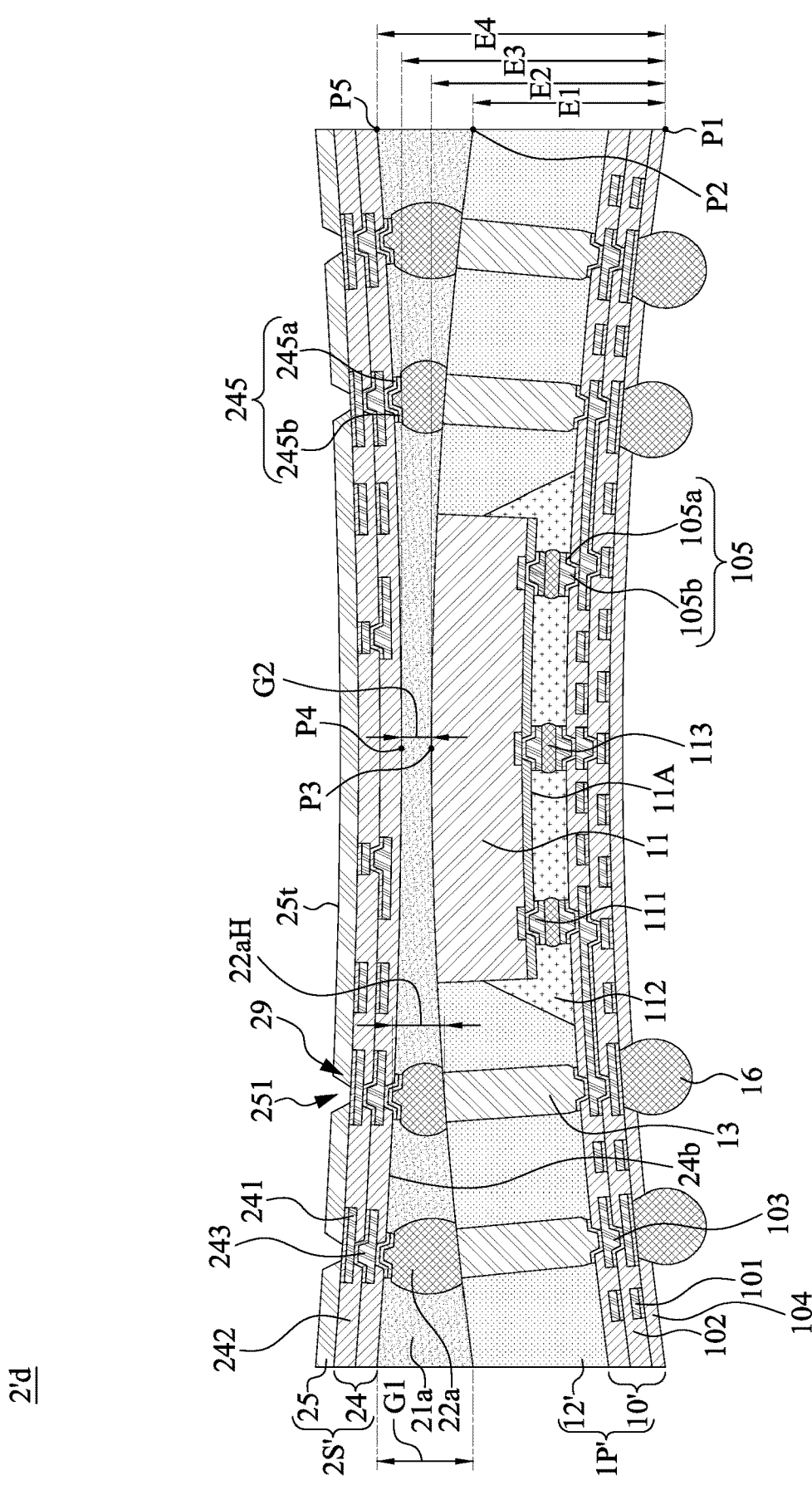
FIG. 2I illustrates a cross-sectional view of an electronic package structure according to some embodiments of the present disclosure.

FIG. 2I is a cross-sectional view of an electronic package structure 2'*d* in accordance with some embodiments of the present disclosure. The electronic package structure 2'*d* is similar to the electronic package structure 2'*a* in FIG. 2F or the electronic package structure 2'*b* in FIG. 2G. except that both the electronic structure 1P' and the substrate 2S' have warpage. The substrate 2S' and the electronic structure 1P' warp toward each other. The first gap G1 is closer to an edge of the substrate 2S' than the second gap G2 is, and the first gap G1 is greater than the second gap G2.

An elevation E1 is defined by points P1 and P2. An elevation E2 is defined by points P1 and P3. An elevation E3 is defined by points P1 and P4. An elevation E5 is defined by points P1 and P5. The point P1 is adjacent to a periphery region of the bottom surface of the electronic structure 1P'. The point is adjacent to a periphery region of the top surface of the electronic structure 1P'. The point P3 is adjacent to a center region of the top surface of the electronic structure 1P'. The center region of the top surface of the electronic structure 1P' is adjacent to a center of the top surface of the electronic structure 1P'. The point P5 is adjacent to a periphery region of the wiring structure 24 of the substrate 2S'. The point P4 is adjacent to a center region of the bottom surface of the wiring structure 24 of the substrate 2S'. The center region of the bottom surface of the wiring structure 24 of the substrate 2S' is adjacent to a center of the bottom surface of the wiring structure 24 of the substrate 2S'. The point P1 is a lowest point of a bottom surface of the circuit structure 10' of the electronic structure 1P'. The point P2 is a lowest point of a top surface of the electronic structure 1P'. The point P3 is a highest point of the top surface of the electronic structure 1P'. The point P4 is a lowest point of a bottom surface 24*b* of the wiring structure 24 of the substrate 2S'. The point P5 is a highest point of the bottom surface 24*b* of the wiring structure 24 of the substrate 2S'. The elevations E1 and E2 may represent the warpage of the electronic structure 1P'. The elevations E3 and E4 may represent the warpage of the wiring structure 24. The elevation E3 of the center region of the wiring structure 24 is lower than the elevation E4 of a periphery region of the wiring structure 24. The elevation E2 of a center region of the package/electronic structure 1P' is higher than the elevation E1 of a periphery region of the package/electronic structure 1P'.

An elevation difference (E4−E3) between the highest point P5 and the lowest point P4 of the bottom surface 24*b* of the wiring structure 24 facing the electronic structure 1P' is less than a height 22*a*H of the bonding element 22*a*. A first warpage (E2−E1) of the electronic structure 1P' is greater than a second warpage (E4−E3) of the wiring structure 24.

The reinforcement element 25 is configured to reduce the warpage (E2−E1) of the electronic structure 1P' and the warpage (E4−E3) of the wiring structure 24 to less than the height 22aH of the bonding element 22a so as to avoid a disconnection between the substrate 2S' and the electronic structure 1P'. The reinforcement element 25 is configured to flatten the wiring structure 24 and the electronic structure 1P'.

Figure 3A:
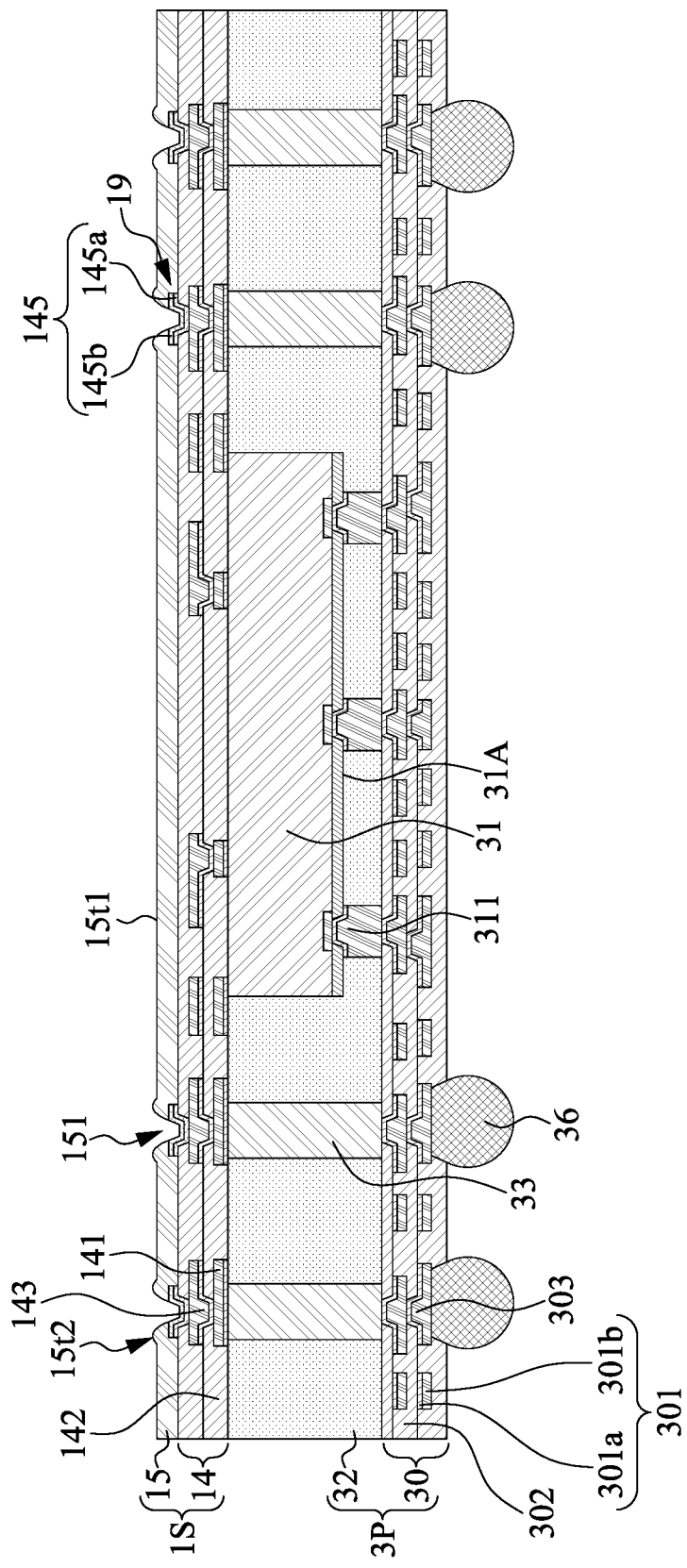
FIG. 3A illustrates a cross-sectional view of an electronic package structure according to some embodiments of the present disclosure.

FIG. 3A is a cross-sectional view of an electronic package structure 3 in accordance with some embodiments of the present disclosure. The electronic package structure 3 includes an electronic structure 3P, a substrate 1S disposed on a top surface of the electronic structure 3P, and an electrical connector 36 (e.g., a solder ball) disposed on a bottom surface of the electronic structure 3P. The substrate 1S is similar to that of FIG. 1A.

The electronic structure 3P includes a circuit structure 30, an electronic device 31, an encapsulant 32, and a conductive element 33.

The circuit structure 30 includes at least one circuit layer 301, at least one dielectric layer 302 in contact with the circuit layer 301, and at least one inner via 303 disposed between two adjacent circuit layers 301. The circuit structure 30 may be an RDL structure. The electrical connector 36 is partially disposed within a recess of the dielectric layer 302. The circuit layer 301 may include a seed layer 301a and a conductive metallic material 301b disposed on the seed layer 301a. The seed layer 301a may include titanium and/or copper. A material of the conductive metallic material 301b may include copper, gold, another conductive metal, or an alloy thereof.

The circuit structure 30 is similar to the circuit structure 10 except that the circuit structure 30 is a reverse type of the circuit structure 10 without the conductive pad 105. A conductive post 311 of the electronic device 31 is in contact with the inner via 303. A bottom surface of the conductive post 311, a bottom surface of the encapsulant 32, and a bottom surface of the conductive element 33 are substantially coplanar with each other.

In some embodiments, the electronic device 31 may include an application-specific integrated circuit (ASIC), a controller, a processor or another electronic component or semiconductor device.

Figure 3B:
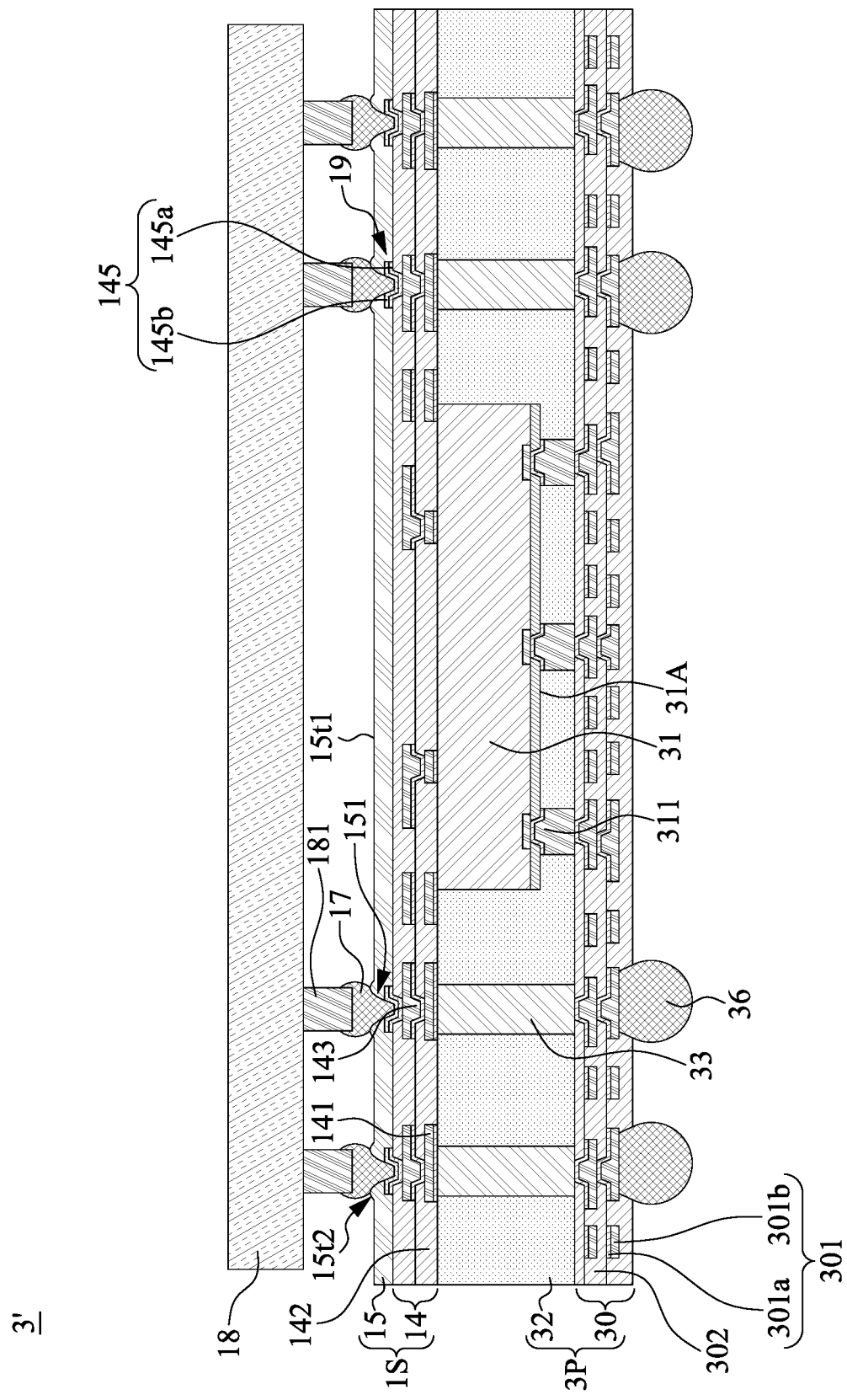
FIG. 3B illustrates a cross-sectional view of an electronic package structure according to some embodiments of the present disclosure.

FIG. 3B is a cross-sectional view of an electronic package structure 3' in accordance with some embodiments of the present disclosure. The electronic package structure 3' is similar to the electronic package structure 3 in FIG. 3A except that an electronic device 18 is disposed on the substrate 1S. The electronic device 18 may be a memory device such as a high bandwidth memory (HBM) die. The electronic device 18 includes a conductive post 181. The electronic device 18 is electrically connected to the UBM layer 145 through a conductor 17 disposed within the opening 151 of the reinforcement element 15. The electronic device 18 may be electrically communicated with the electronic device 31 through the RDL structure 14, the conductive element 33 and the circuit structure 30.

FIGS. 4A through 4F illustrate some embodiments of a method of manufacturing the electronic package structure 1 according to some embodiments of the present disclosure.

Figure 4A:
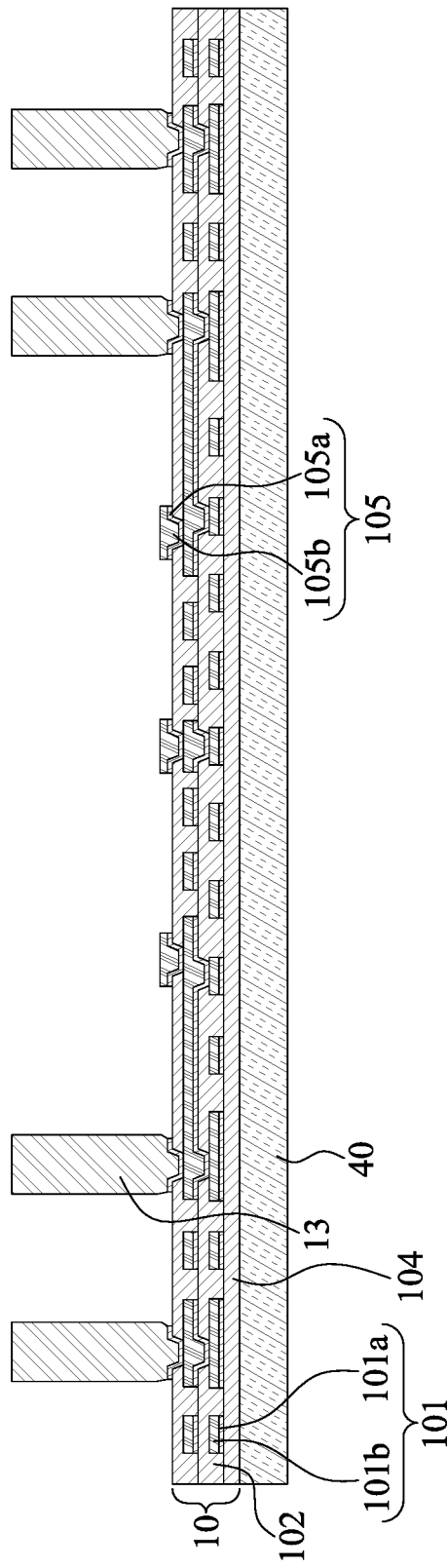
FIG. 4A illustrates a method of manufacturing an electronic package structure according to some embodiments of the present disclosure.

Referring to FIG. 4A, a method of manufacturing the electronic package structure 1 includes providing a carrier 40. A circuit structure 10 is disposed on the carrier 40. The circuit structure 10 includes a dielectric layer 104, a first circuit layer 101 disposed on the dielectric layer 104, a first dielectric layer 102 disposed on the dielectric layer 104, a second circuit layer 101 disposed on the first dielectric layer 102, a second dielectric layer 102 disposed on the first dielectric layer 102, inner vias 103 disposed on first circuit layer 101, and respective conductive pads 105 disposed on the respective inner vias 103.

The dielectric layer 104 is disposed on the carrier 40. The dielectric layer 104 may include a solder resist layer. The dielectric layer 102 may be made of a cured photoimageable dielectric (PID) material such as epoxy or polyimide (PI) including photoinitiators.

The circuit layer 101 may include a seed layer 101a and a conductive metallic material 101b disposed on the seed layer 101a. The circuit layer 101 may be a fan-out circuit layer or an RDL. The seed layer 101a may include titanium and/or copper. The conductive metallic material 101b may include copper, gold, another conductive metal, or an alloy thereof. The conductive pad 105 may include a seed layer 105a and a conductive metallic material 105b disposed on the seed layer 105a. The seed layer 105a may include titanium and/or copper. The conductive metallic material 105b may include copper, gold, another conductive metal, or an alloy thereof.

A conductive element 13 is disposed on a patterned seed layer 105a. The conductive element 13 may be a preformed conductive pillar. The conductive element 13 may include copper, gold, another conductive metal, or an alloy thereof.

Figure 4B:
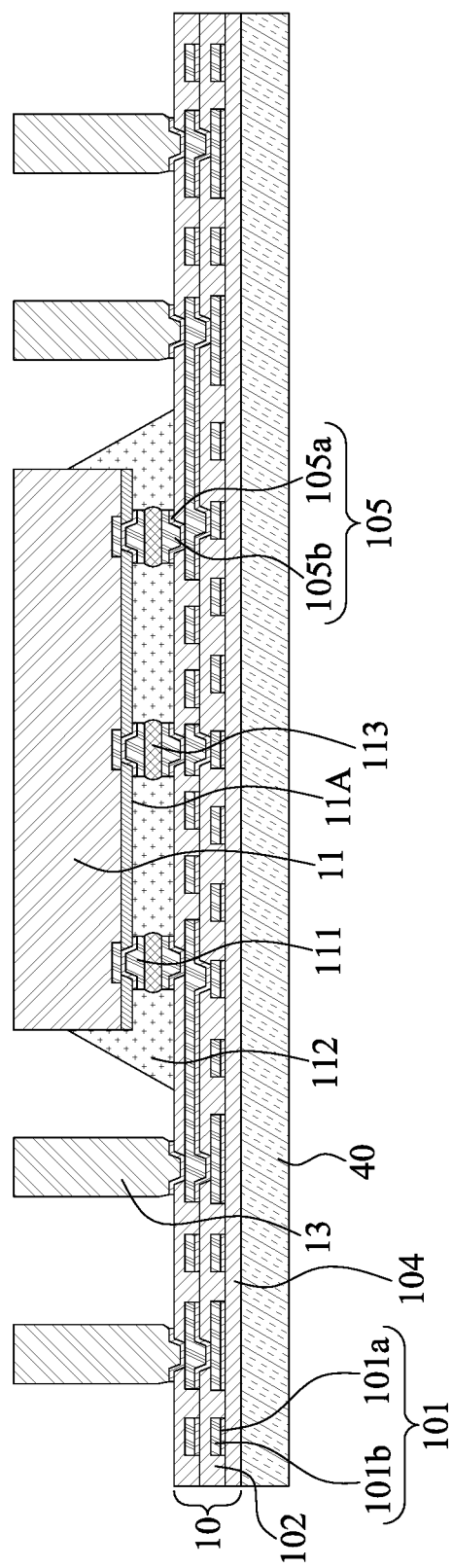
FIG. 4B illustrates a method of manufacturing an electronic package structure according to some embodiments of the present disclosure.

Referring to FIG. 4B, an electronic device 11 is disposed on the circuit structure 10. The electronic device 11 has an active surface 11A. The electronic device 11 has a conductive post 111. The conductive post 111 is electrically connected to the conductive pad 105 through an internal connector 113 (e.g., a solder material). The electronic device 11 includes an underfill 112. The underfill 112 is disposed in a space between the electronic device 11 and the circuit structure 10. The underfill 112 encapsulates the conductive post 111, the internal connector 113, and the conductive pad 105.

Figure 4C:
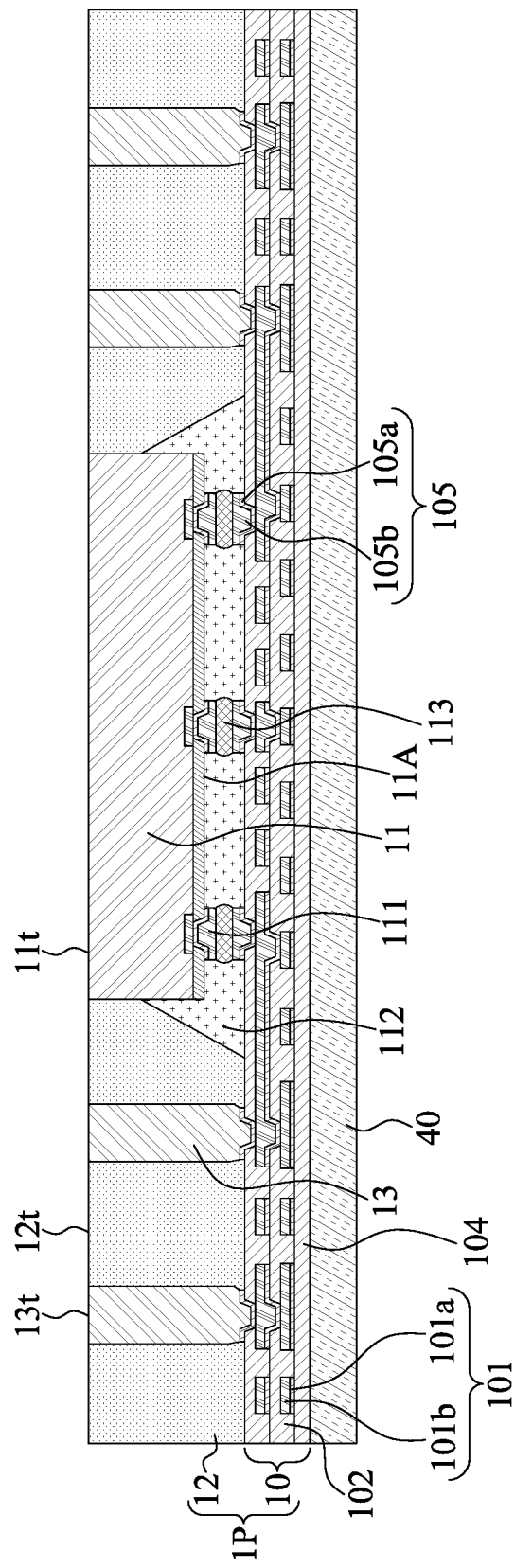
FIG. 4C illustrates a method of manufacturing an electronic package structure according to some embodiments of the present disclosure.

Referring to FIG. 4C, an encapsulant 12 is disposed on the circuit structure 10 to form an electronic structure 1P. The encapsulant 12 may be formed by a molding operation. The encapsulant 12 may be a molding compound with or without fillers. The encapsulant 12 encapsulates the electronic device 11 and the conductive element 13. A grinding operation may be performed so as to make a top surface 11t of the electronic device 11, a top surface 12t of the encapsulant 12, and a top surface 13t of the conductive element 13 be substantially coplanar.

Figure 4D:
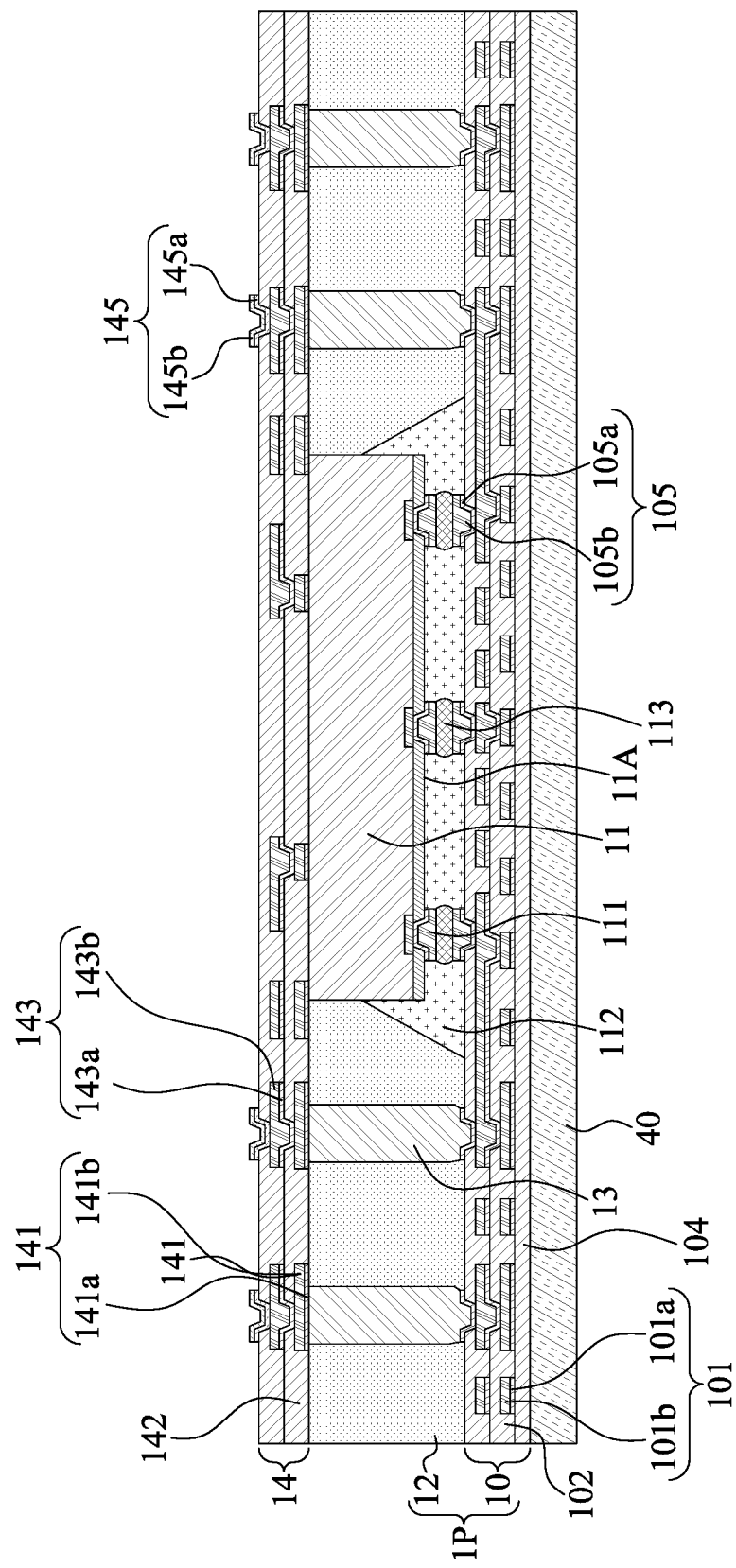
FIG. 4D illustrates a method of manufacturing an electronic package structure according to some embodiments of the present disclosure.

Referring to FIG. 4D, a wiring structure 14 is formed or provided on the electronic structure 1P. The wiring structure 14 may include an RDL structure. The RDL structure 14 includes circuit layers 141, dielectric layers 142, inner vias 143, and electrical contacts 145. The dielectric layer 142 may be made of a cured photoimageable dielectric (PID) material such as epoxy or polyimide (PI) including photoinitiators. The respective circuit layer 141 includes a seed layer 141a and a conductive metallic material 141b disposed on the seed layer 141a. The seed layer 141a may include titanium and/or copper. The conductive metallic material 141b may include copper, gold, another conductive metal, or an alloy thereof. The respective inner via 143 includes a seed layer 143a and a conductive metallic material 143b disposed on the seed layer 143a. The seed layer 143a may include titanium and/or copper. The conductive metallic material 143b may include copper, gold, another conductive metal, or an alloy thereof. The respective electrical contact 145 includes a seed layer 145a and a conductive metallic material 145b disposed on the seed layer 145a. A material of the seed layer 145a may include nickel and/or copper. A material of the conductive layer 145*b* may include copper, gold, another conductive metal, or an alloy thereof. The electrical contacts 145 may be conductive pads, UBM layers, or a combination thereof. The electrical contacts 145 may act as a stop layer. The electrical contacts 145 is electrically connected to the circuit layers 141 through the inner vias 143.

In some embodiments, the RDL structure 14 may be a preformed structure.

Figure 4E:
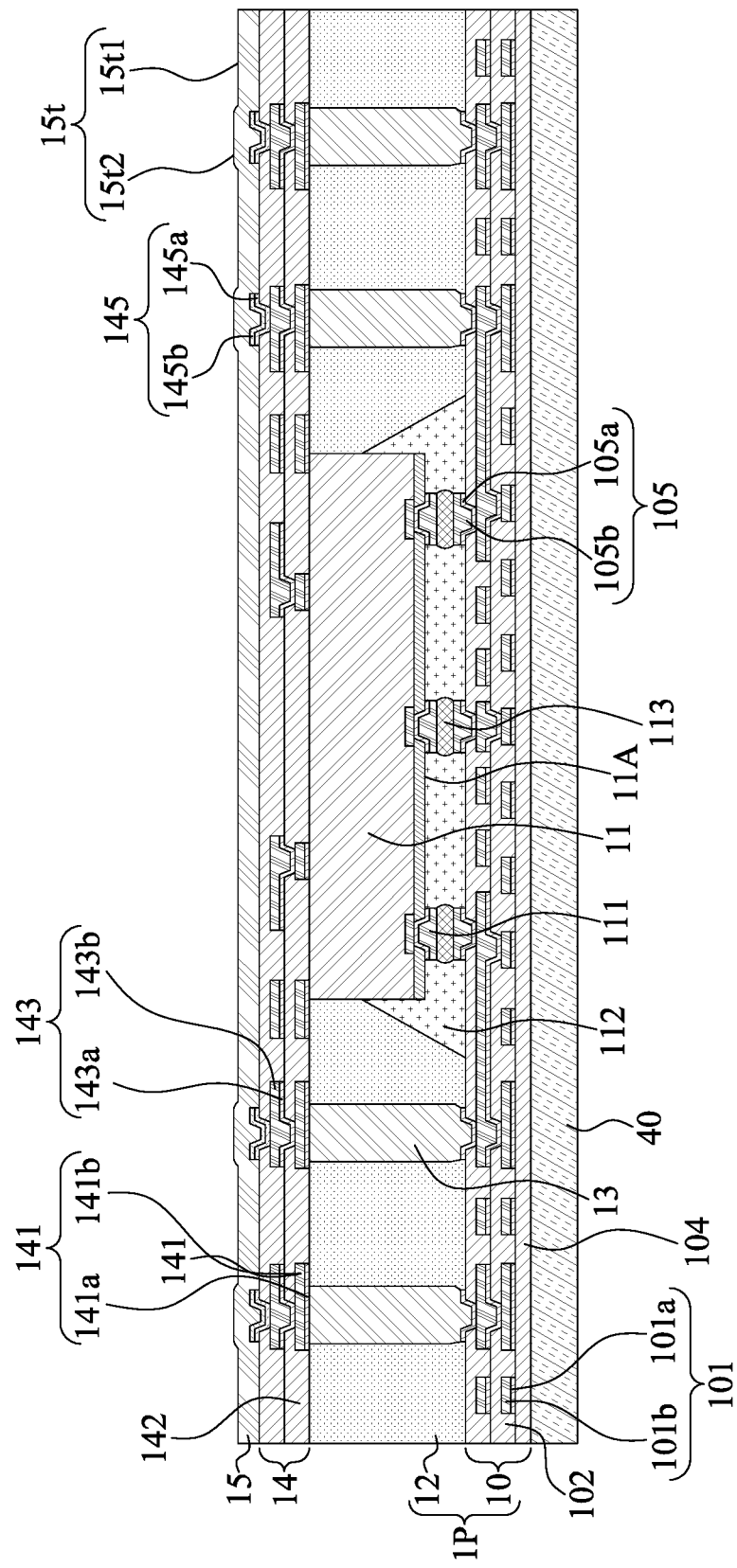
FIG. 4E illustrates a method of manufacturing an electronic package structure according to some embodiments of the present disclosure.

Referring to FIG. 4E, a reinforcement element 15 is disposed on the RDL structure 14. The reinforcement element 15 is in contact with the dielectric layer 142 and the electrical contacts 145. The reinforcement element 15 is laminated on the RDL structure 14. The reinforcement element 15 may be a film type molding compound or film type epoxy resin. The reinforcement element 15 is conformal with the electrical contacts 145 and a top surface of the RDL structure 14 by a lamination operation.

The reinforcement element 15 has a top surface 15*t*. The top surface 15*t* includes a portion 15*t*1 and a portion 15*t*2. The portion 15*t*2 is higher than the portion 15*t*1. The portion 15*t*1 extends over the second circuit layers 141 and the second dielectric layer 142. The portion 15*t*2 extends over the electrical contacts 145.

Figure 4F:
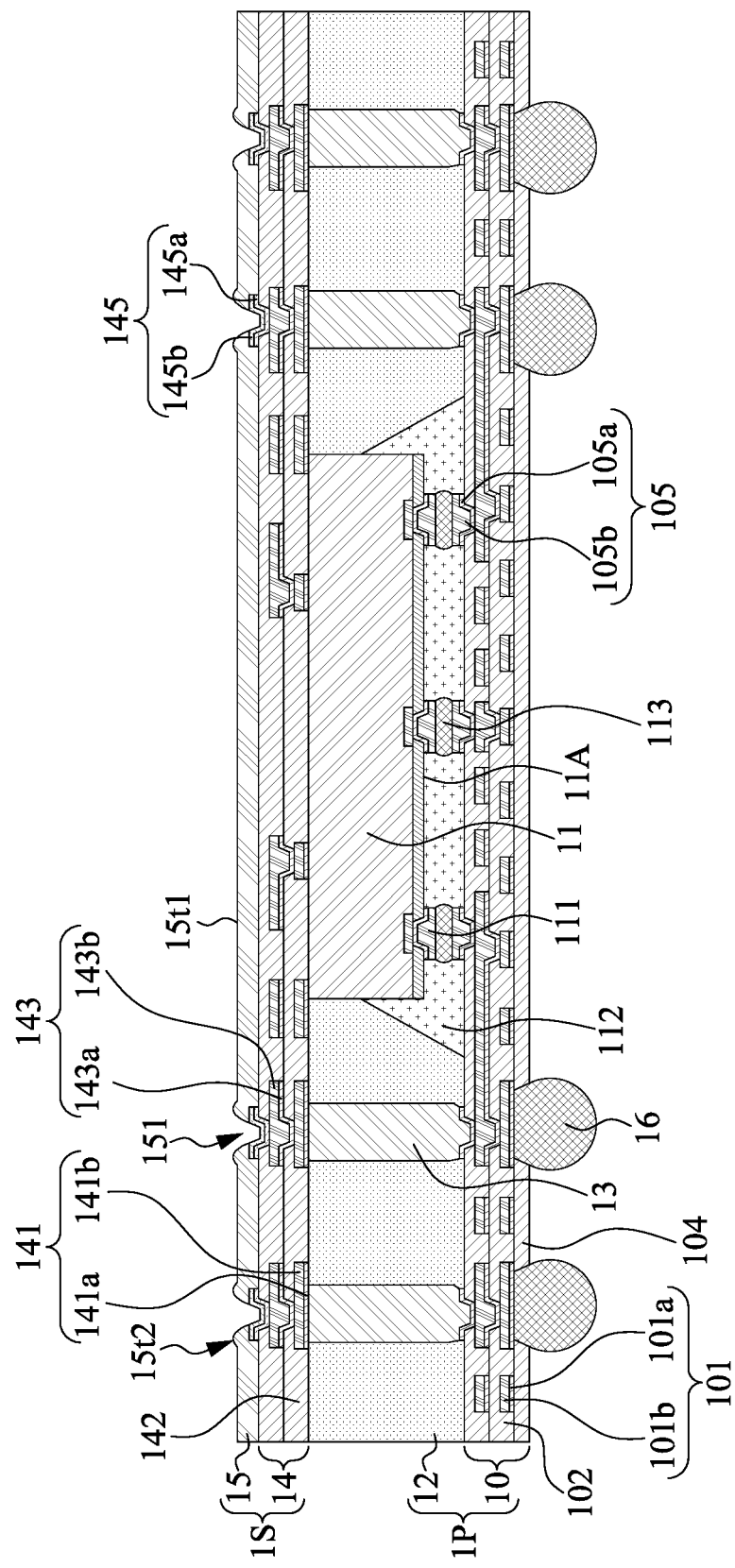
FIG. 4F illustrates a method of manufacturing an electronic package structure according to some embodiments of the present disclosure.

Referring to FIG. 4F, a portion of the reinforcement element 15 is removed to form openings 151 to expose the electrical contacts 145. The electrical contacts 145 is defined by the portion 15*t*2.

After the removing operation, the substrate 1S is completed. Subsequently, a singulation operation is performed to form the electronic package structure 1.

FIGS. 5A through 5I illustrate some embodiments of a method of manufacturing an electronic package structure 2 according to some embodiments of the present disclosure.

Figure 5A:
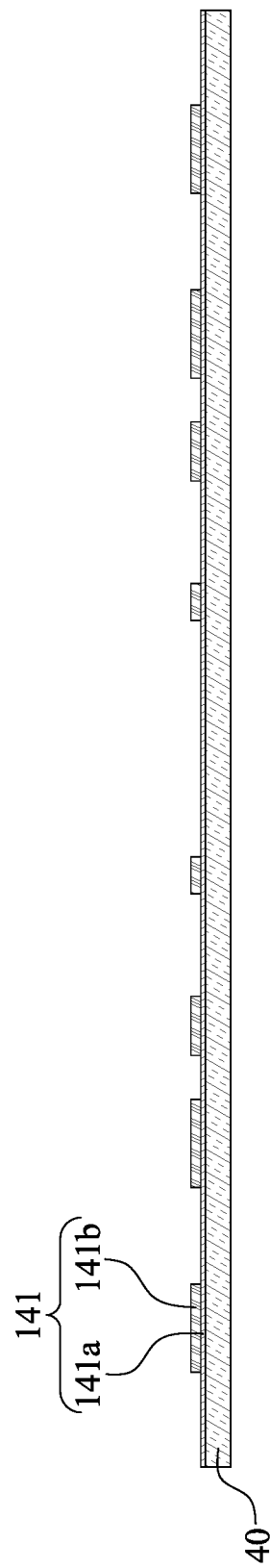
FIG. 5A illustrates a method of manufacturing an electronic package structure according to some embodiments of the present disclosure.

Referring to FIG. 5A, a method of manufacturing the electronic package structure 2 includes providing a carrier 40. A first seed layer 141*a* is formed on the carrier 40. A first patterned conductive layer 141*b* is formed on the first seed layer 141*a*. The first patterned conductive layer 141*b* is formed by an electroplating operation. In some embodiments, the first patterned conductive layer 141*b* may be formed by a sputter operation to obtain a good quality. A material of the first seed layer 141*a* may include titanium and/or copper. A material of the first patterned conductive layer 141*b* may include copper, gold, another conductive metal, or an alloy thereof.

Figure 5B:
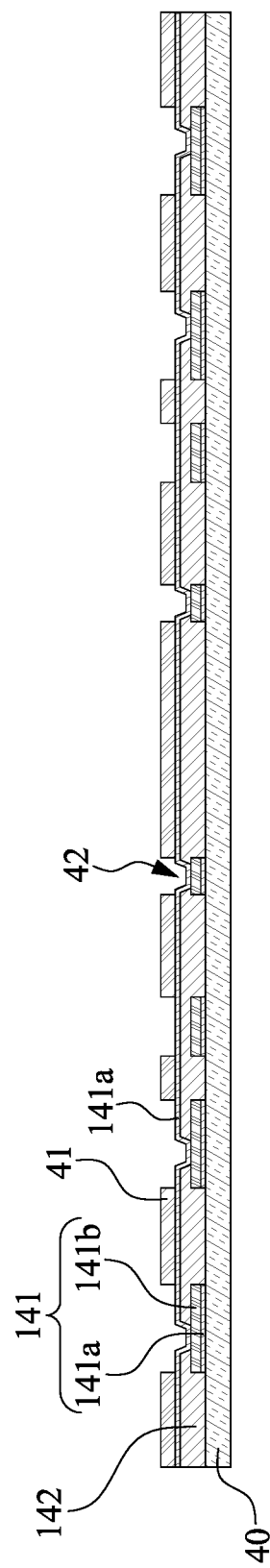
FIG. 5B illustrates a method of manufacturing an electronic package structure according to some embodiments of the present disclosure.

Referring to FIG. 5B, the first seed layer 141*a* may be partially removed to form a first circuit layer 141. A first dielectric layer 142 is formed on the carrier 40. The first dielectric layer 142 is patterned to expose the first circuit layer 141. Subsequently, a second seed layer 141*a* is formed on the first dielectric layer 142. A patterned photoresist layer 41 is disposed on the second seed layer 141*a*. The patterned photoresist layer 41 defines openings 42 to expose the second seed layer 141*a*. The dielectric layer 142 may be made of a cured photoimageable dielectric (PID) material such as epoxy or polyimide (PI) including photoinitiators.

Figure 5C:
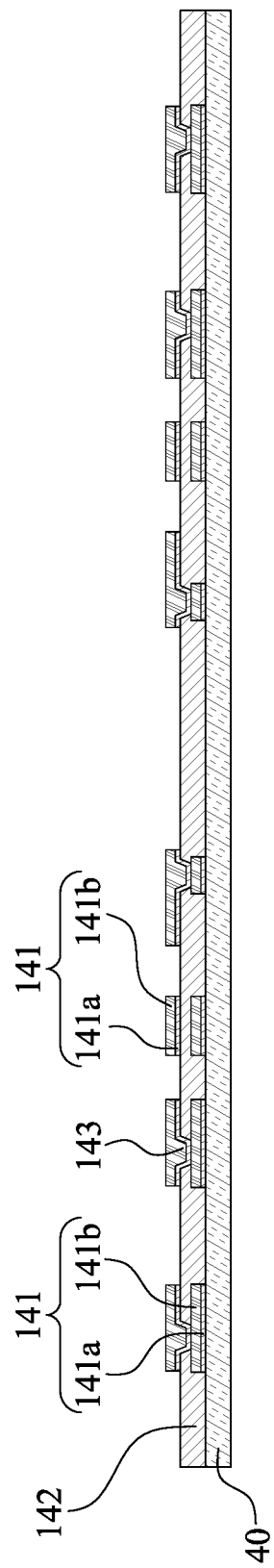
FIG. 5C illustrates a method of manufacturing an electronic package structure according to some embodiments of the present disclosure.

Referring to FIG. 5C, an electroplating operation is performed to filling conductive materials in the openings 42. A second patterned conductive layer 141*b* and inner vias 143 are formed on the second seed layer 141*a* and within the opening 42. The respective inner via 143 is in contact with the respective first circuit layer 141. Subsequently, the patterned photoresist layer 41 is removed, and then the second seed layer 141*a* is partially removed to form a second circuit layer 141.

Figure 5D:
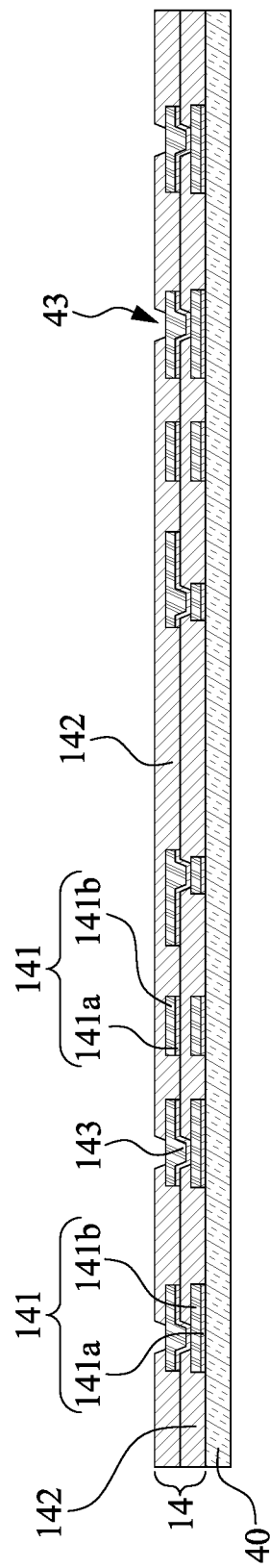
FIG. 5D illustrates a method of manufacturing an electronic package structure according to some embodiments of the present disclosure.

Referring to FIG. 5D, a second dielectric layer 142 is formed on the first dielectric layer 142. The second dielectric layer 142 is patterned to define openings 43 for exposing the second circuit layers 141 and the inner vias 143 such that a wiring structure 14 is formed. The wiring structure 14 may be an RDL structure. There is an interference or a boundary between the first and second dielectric layers 142.

Figure 5E:
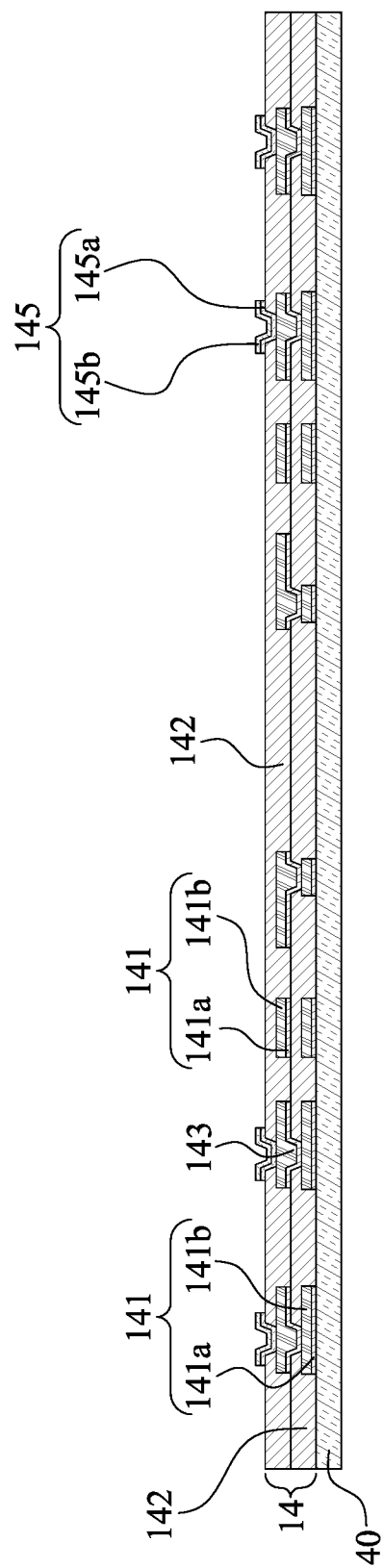
FIG. 5E illustrates a method of manufacturing an electronic package structure according to some embodiments of the present disclosure.

Referring to FIG. 5E, the wiring structure 14 includes electrical contacts 145. A patterned seed layer 145*a* is formed in the openings 43. A patterned conductive layer 145*b* is formed on the patterned seed layer 145*a* to form the electrical contacts 145. The electrical contacts 145 are formed in the openings 43 and extend on the second dielectric layer 142. The electrical contacts 145 are in contact with the inner vias 143. A material of the patterned seed layer 145*a* may include nickel and/or copper. A material of the patterned conductive layer 145*b* may include copper, gold, another conductive metal, or an alloy thereof. In some embodiments, the electrical contacts 145 may be conductive pads, UBM layers, or a combination thereof. The electrical contacts 145 may act as a stop layer.

Figure 5F:
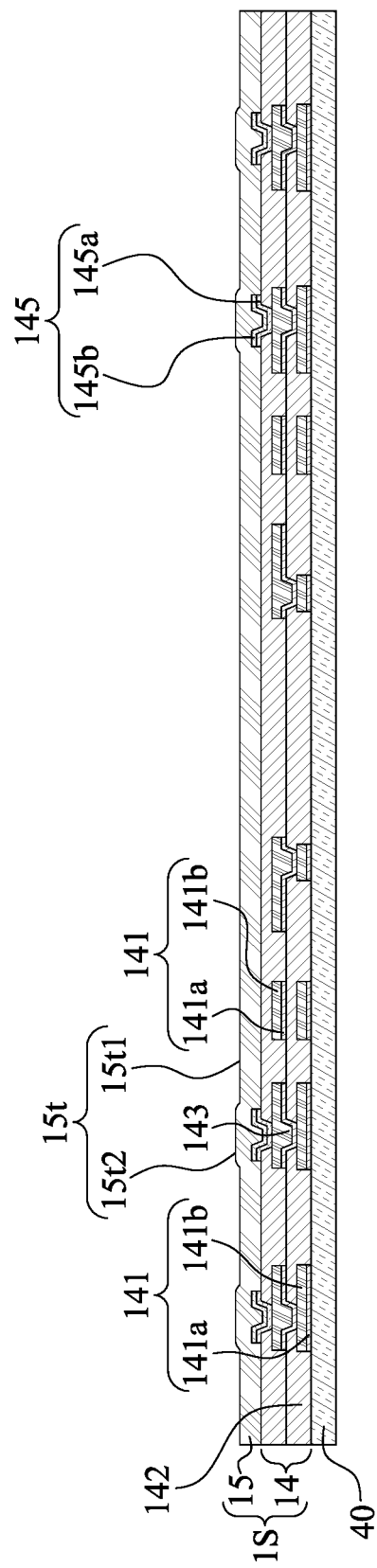
FIG. 5F illustrates a method of manufacturing an electronic package structure according to some embodiments of the present disclosure.

Referring to FIG. 5F, a reinforcement element 15 is disposed on the wiring structure 14. The reinforcement element 15 is in contact with the second dielectric layer 142 and the electrical contacts 145. The reinforcement element 15 is laminated on the wiring structure 14. The reinforcement element 15 may be a film type material that is attached or adhered to the top surface of the wiring structure 14. In some embodiments, the reinforcement element 15 may include a molding compound, an epoxy resin, or other suitable materials. The reinforcement element 15 may include a film type molding compound. The reinforcement element 15 may include fillers. The reinforcement element 15 is conformal with the electrical contacts 145 and a top surface of the wiring structure 14 by a lamination operation.

The reinforcement element 15 has a top surface 15*t*. The top surface 15*t* includes a portion 15*t*1 and a portion 15*t*2. The portion 15*t*2 is higher than the portion 15*t*1. The portion 15*t*1 extends over the second circuit layers 141 and the second dielectric layer 142. The portion 15*t*2 extends over the electrical contacts 145.

In some embodiments, a thickness of the reinforcement element 15 may be in a range from around 30 µm to around 50 µm. Considering that a substrate 1S composed of the wiring structure 14 and the reinforcement element 15 would be disposed on a package and/or at least one electronic device would be disposed on the substrate 1S, the thickness of the reinforcement element 15 may be predefined or preadjusted to eliminate the warpage of an entire electronic package structure.

Figure 5G:
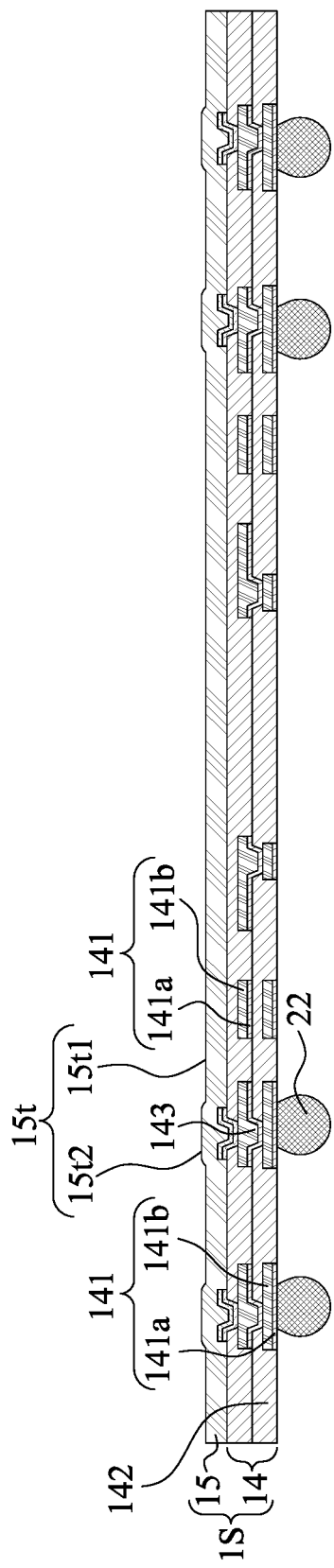
FIG. 5G illustrates a method of manufacturing an electronic package structure according to some embodiments of the present disclosure.

Referring to FIG. 5G, a reflowable material/bonding element 22 is disposed on a bottom surface of the substrate 1S. The reflowable material 22 is in contact with the first circuit layer 141. The reflowable material 22 may include a solder ball, a solder bump or a solder paste.

Figure 5H:
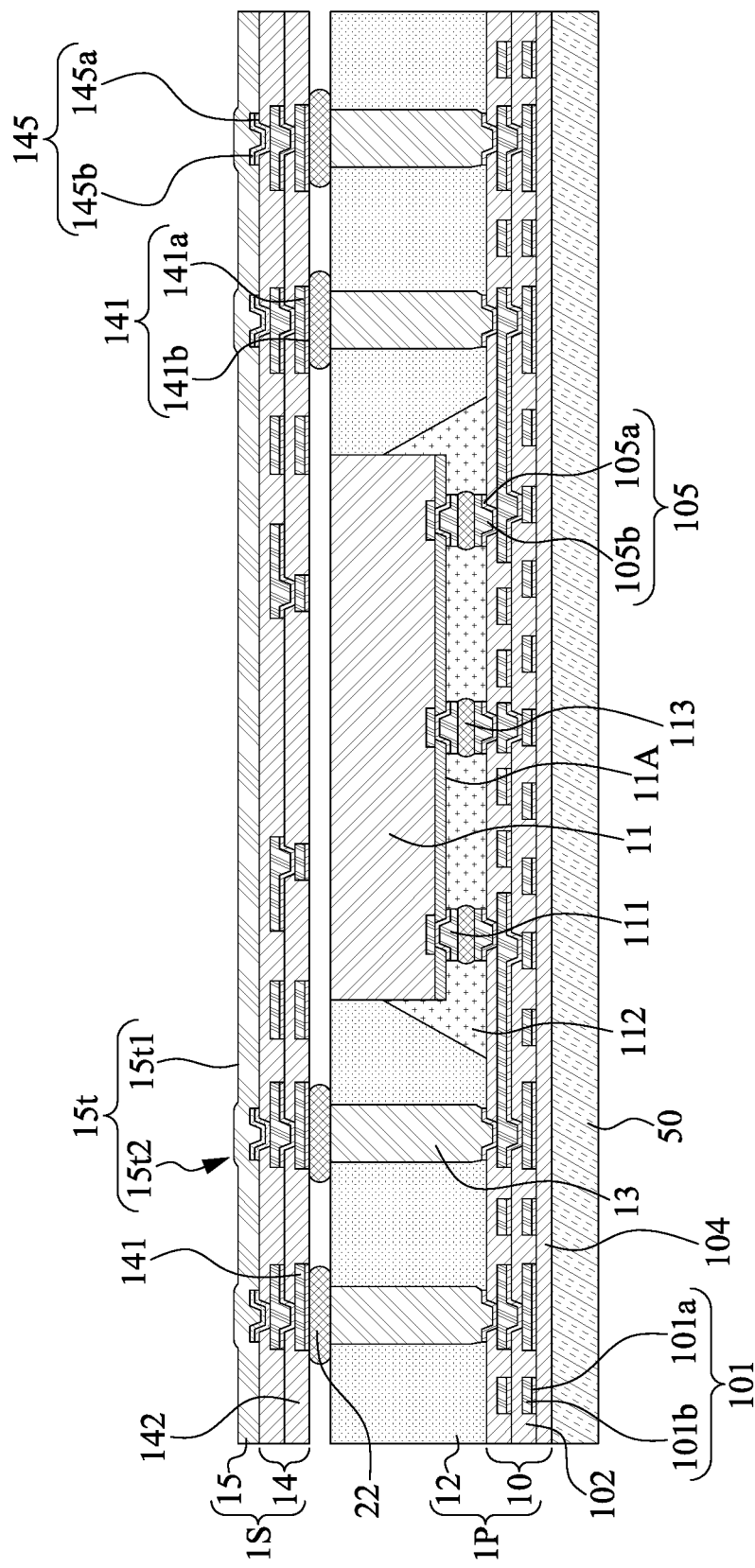
FIG. 5H illustrates a method of manufacturing an electronic package structure according to some embodiments of the present disclosure.

Referring to FIG. 5H, the substrate 1S is disposed on an electronic structure 1P. The method of manufacturing the electronic structure 1P is similar to the method of manufacturing the electronic structure 1P of FIGS. 4A to 4C.

The electronic structure 1P and that the substrate 1S is electrically connected to the electronic structure 1P through the reflowable material 22. The reflowable material 22 is disposed on the conductive element 13. The substrate 1S is attached to or bonded to the electronic structure 1P through a thermo-compression bonding technique, thus, the reflowable material 22 may be squashed in a disk shape. The reflowable material 22 may cover and contact a portion of the first dielectric layer 142 of the wiring structure 14. Further, the reflowable material 22 may cover and contact a portion of the encapsulant 12. A minimum width of the reflowable material 22 may be greater than a width of the conductive element 13. There may be an interference or a boundary between the reflowable material 22 and the encapsulant 12. A width of a region that the reflowable material 22 contacts the encapsulant 12 may be greater than the width of the conductive element 13.

Subsequently, an underfill 21 is disposed between the substrate 1S and the electronic structure 1P by an injection operation. The underfill 21 encapsulates the reflowable material 22.

Figure 5I:
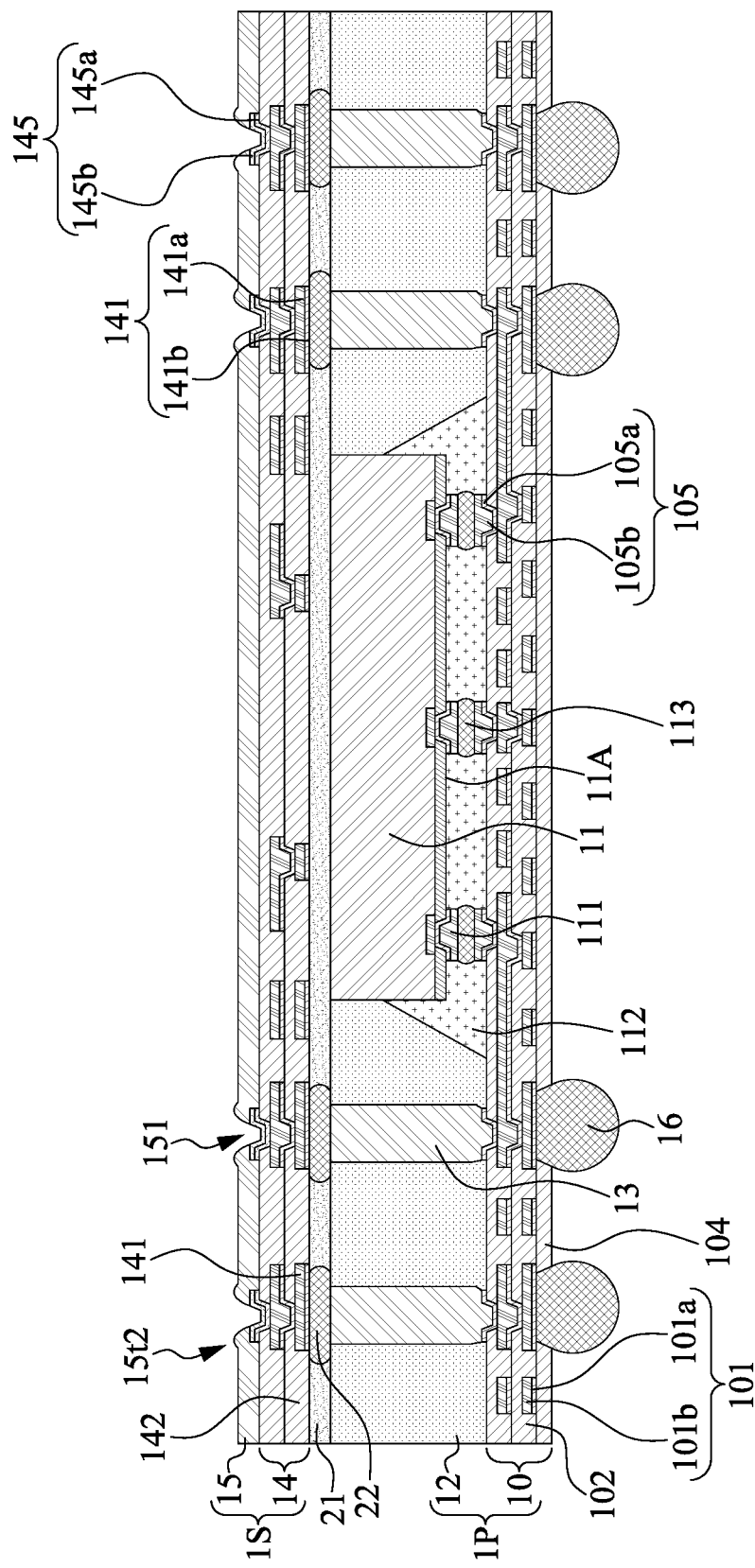
FIG. 5I illustrates a method of manufacturing an electronic package structure according to some embodiments of the present disclosure.

Referring to FIG. 5I, a portion of the reinforcement element 15 is removed to form an opening 151 to expose the electrical contact 145. The carrier 40 is removed, and then the dielectric layer 104 is patterned to form openings so as to accommodate electrical connectors 16 (e.g., solder ball). Subsequently, a singulation operation is performed to form the electronic package structure 2.

FIGS. 6A through 6I illustrate some embodiments of a method of manufacturing an electronic package structure 2' according to some embodiments of the present disclosure.

Referring to FIGS. 6A to 6E, the method of manufacturing a wiring structure 24 is similar to the method of manufacturing the wiring structure 14 of FIGS. 5A to 5E. The wiring structure 24 includes a first circuit layer 241, a second circuit layer 241, a first dielectric layer 242, a second dielectric layer 242, inner vias 243, and UBM layers 245. The respective first/second circuit layer 241 includes a first/second seed layer 241$a$ and a first/second conductive material 241$b$. The respective inner via 243 includes a seed layer 243$a$ and a conductive material 243$b$. The respective UBM layer 245 includes a seed layer 245$a$ and a conductive material 245$b$.

Figure 6A:
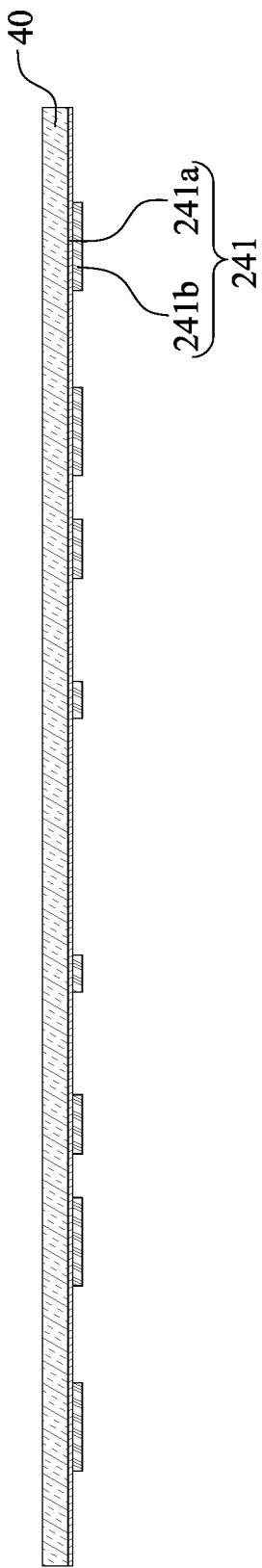
FIG. 6A illustrates a method of manufacturing an electronic package structure according to some embodiments of the present disclosure.
Figure 6B:
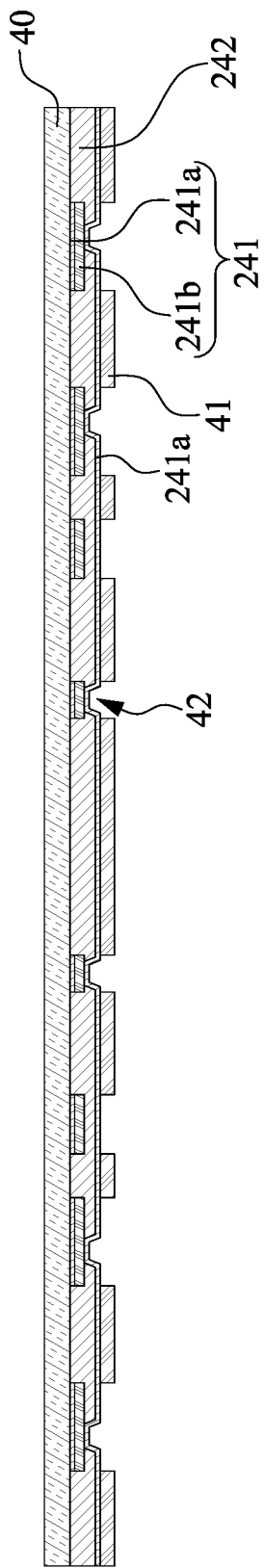
FIG. 6B illustrates a method of manufacturing an electronic package structure according to some embodiments of the present disclosure.
Figure 6C:
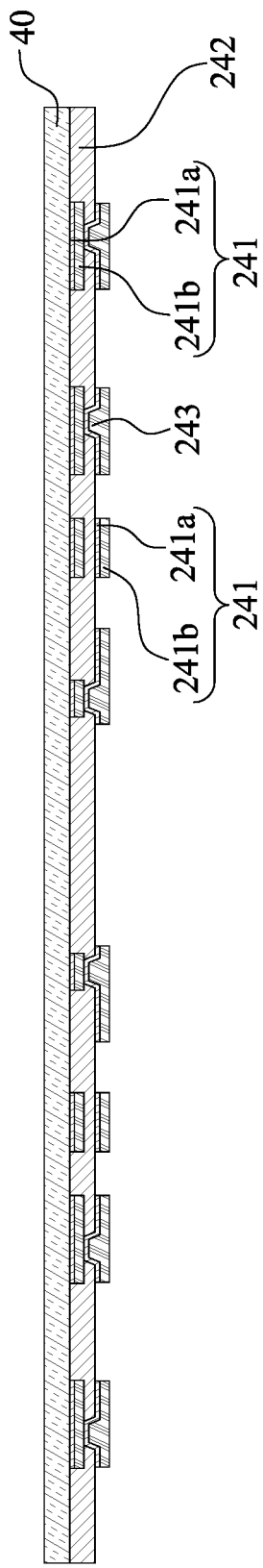
FIG. 6C illustrates a method of manufacturing an electronic package structure according to some embodiments of the present disclosure.
Figure 6D:
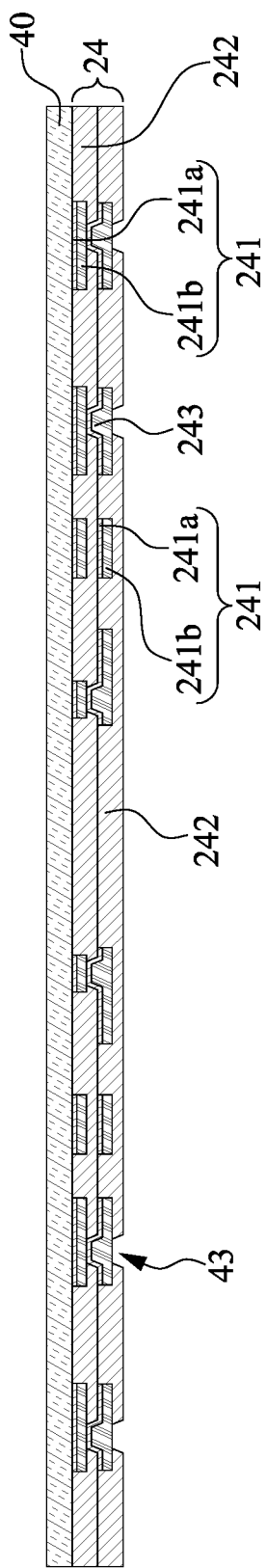
FIG. 6D illustrates a method of manufacturing an electronic package structure according to some embodiments of the present disclosure.
Figure 6E:
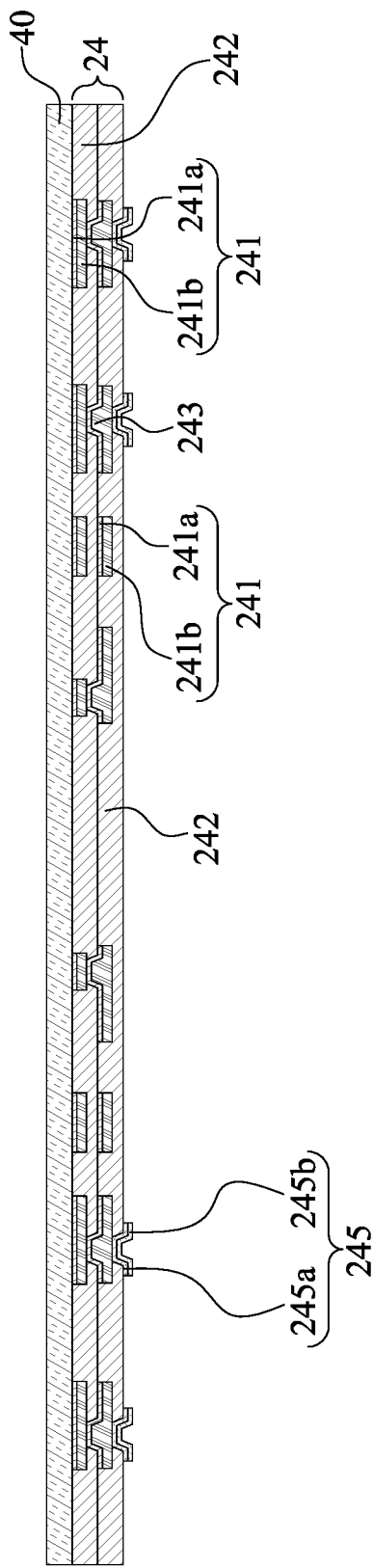
FIG. 6E illustrates a method of manufacturing an electronic package structure according to some embodiments of the present disclosure.
Figure 6F:
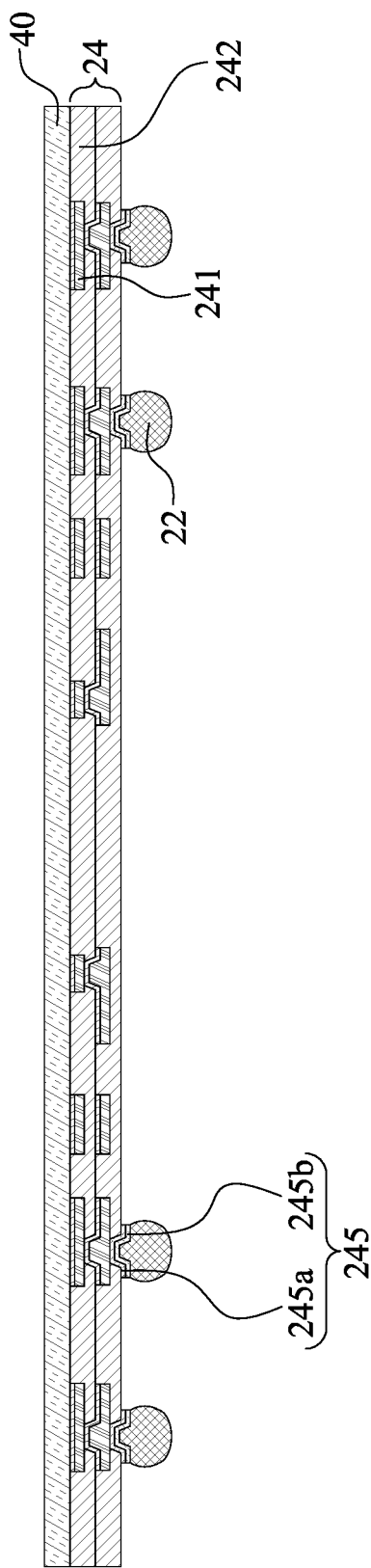
FIG. 6F illustrates a method of manufacturing an electronic package structure according to some embodiments of the present disclosure.

Referring to FIG. 6F, a reflowable material/bonding element 22 is disposed on a bottom surface of the wiring structure 24. The reflowable material 22 is in contact with the UBM layer 245.

Figure 6G:
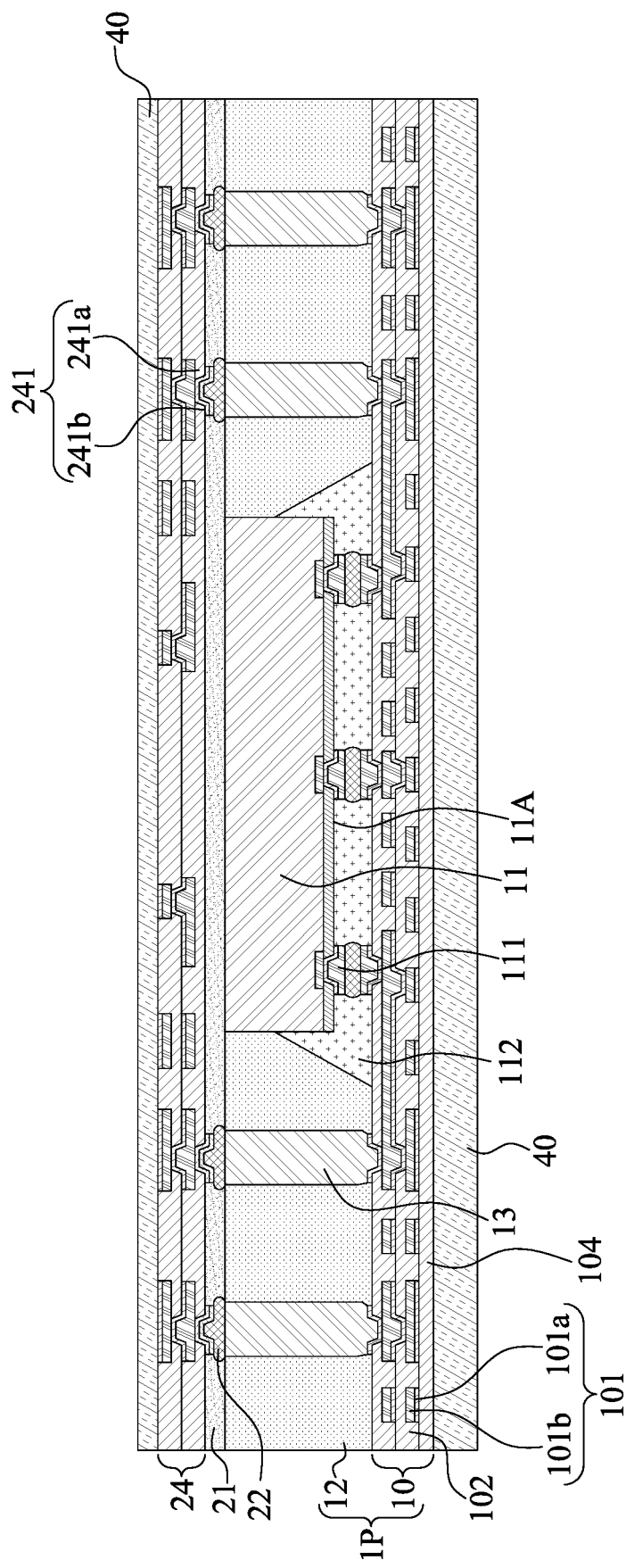
FIG. 6G illustrates a method of manufacturing an electronic package structure according to some embodiments of the present disclosure.

Referring to FIG. 6G, the wiring structure 24 is disposed on an electronic structure 1P. The UBM layers 245 face the conductive element 13 of the electronic structure 1P. The method of manufacturing the electronic structure 1P is similar to the method of manufacturing the electronic structure 1P of FIGS. 4A to 4C. Similar to the structure of FIG. 5H, the wiring structure 24 is attached to or bonded to the electronic structure 1P through a thermo-compression bonding technique, thus, the reflowable material 22 may be squashed in a disk shape. Subsequently, an underfill 21 is disposed between the wiring structure 24 and the electronic structure 1P. The underfill 21 encapsulates the reflowable material 22.

Figure 6H:
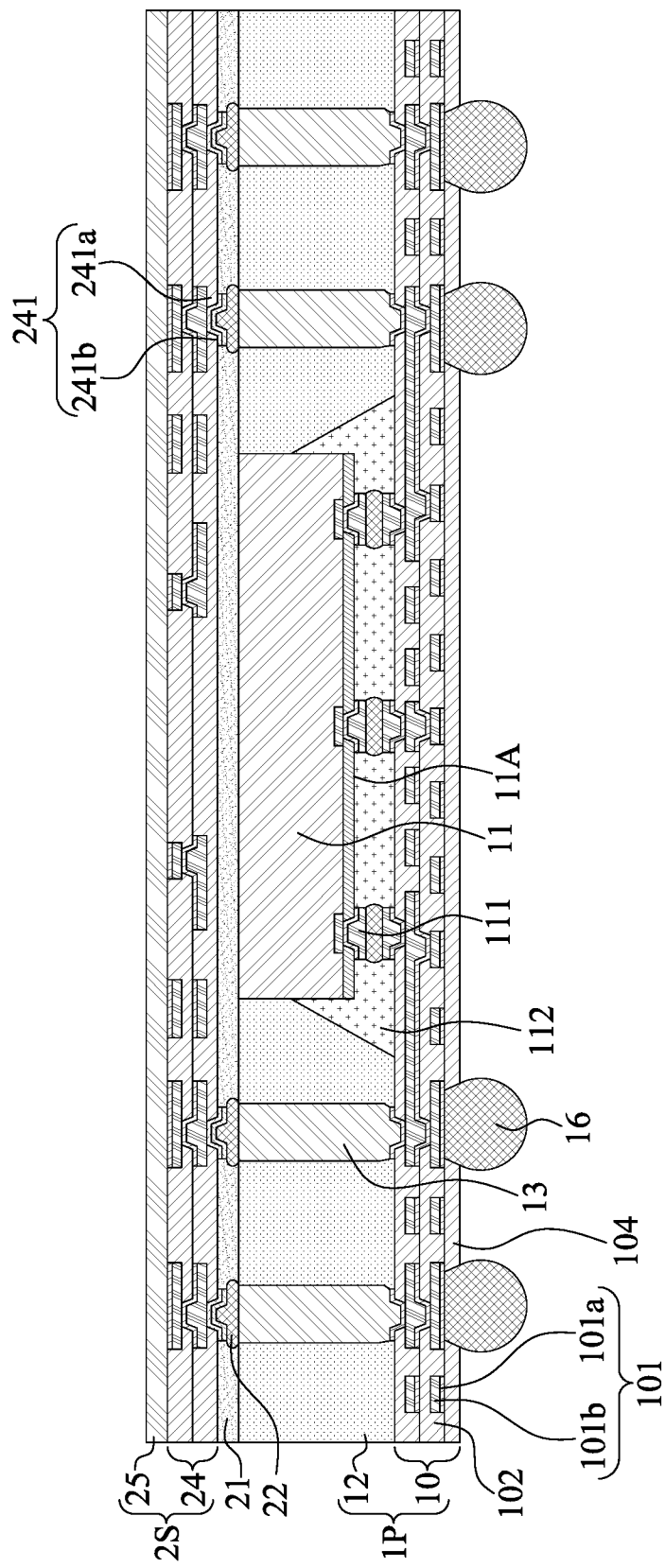
FIG. 6H illustrates a method of manufacturing an electronic package structure according to some embodiments of the present disclosure.

Referring to FIG. 6H, the carriers 40 are removed. Subsequently, the dielectric layer 104 is patterned to form openings so as to accommodate electrical connectors 16 (e.g., solder ball).

Figure 6I:
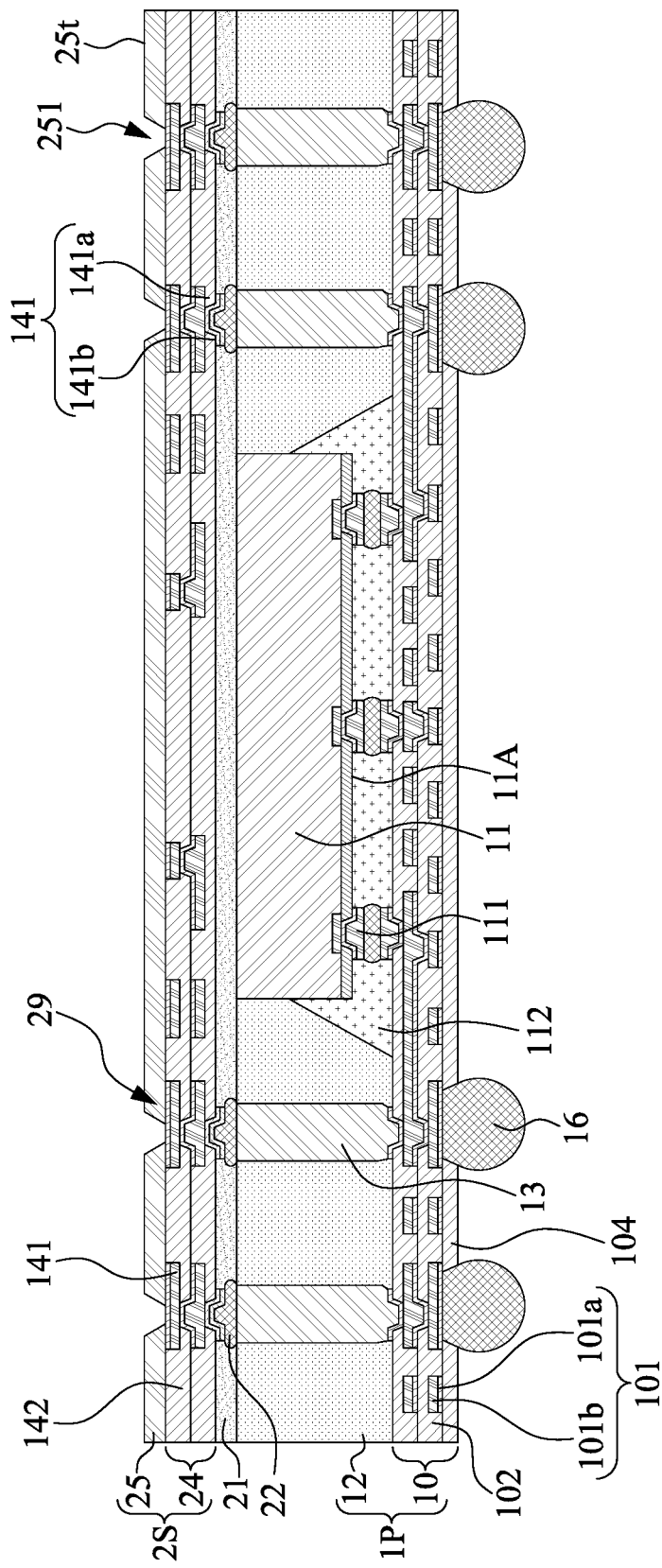
FIG. 6I illustrates a method of manufacturing an electronic package structure according to some embodiments of the present disclosure.

Referring to FIG. 6I, a reinforcement element 25 is disposed on a top surface of the wiring structure 24. The reinforcement element 25 is in contact with the first circuit layer 241 and the first dielectric layer 242. The reinforcement element 25 is laminated on the wiring structure 24. A material of the reinforcement element 25 is similar to the material of the reinforcement element 15. The reinforcement element 25 may be a film type molding compound or film type epoxy resin. The reinforcement element 25 is conformal with the top surface of the wiring structure 24 by a lamination operation. A top surface 25$t$ of the reinforcement element 25 is substantially planar. A portion of the reinforcement element 25 is removed to form an opening 251 to expose the first circuit layer 241 so as to form the substrate 2S. The first circuit layer 241 may be an electrical contact 29. The first circuit layer 241 may be a conductive pad. Subsequently, a singulation operation is performed to form the electronic package structure 2'.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. An electronic package structure, comprising:
   an electronic structure;
   a wiring structure disposed over the electronic structure;
   a bonding element connecting the wiring structure and the electronic structure; and
   a reinforcement element attached to the wiring structure;

wherein an elevation difference between a highest point and a lowest point of a surface of the wiring structure facing the electronic structure is less than a height of the bonding element, wherein the bonding element and the reinforcement layer are disposed adjacent to two opposite sides of the wiring structure, respectively, and wherein a hardness of the reinforcement element is greater than a hardness of the wiring structure.

2. The electronic package structure of claim 1, wherein a rigidity of the reinforcement element is greater than a rigidity of the wiring structure.

3. The electronic package structure of claim 1, wherein a width of the bonding element is greater than a height of the bonding element.

4. The electronic package structure of claim 1, wherein the reinforcement element defines an opening to expose an electrical contact of the wiring structure for external connection.

5. The electronic package structure of claim 4, wherein an inner side surface of the reinforcement element includes a curved shape.

6. The electronic package structure of claim 4, wherein a top surface of the reinforcement element includes a protrusion portion.

7. An electronic package structure, comprising:
an electronic structure;
a wiring structure disposed over the electronic structure;
a bonding element connecting the wiring structure and the electronic structure; and
a reinforcement element attached to the wiring structure;
wherein an elevation difference between a highest point and a lowest point of a surface of the wiring structure facing the electronic structure is less than a height of the bonding element, and
wherein a coefficient of thermal conductivity of the reinforcement element is greater than a coefficient of thermal conductivity of the wiring structure.

8. An electronic package structure, comprising:
an electronic structure;
a wiring structure disposed over the electronic structure;
a bonding element connecting the wiring structure and the electronic structure; and
a reinforcement element attached to the wiring structure;
wherein an elevation difference between a highest point and a lowest point of a surface of the wiring structure facing the electronic structure is less than a height of the bonding element,
wherein the bonding element and the reinforcement layer are disposed adjacent to two opposite sides of the wiring structure, respectively, and
wherein a coefficient of thermal expansion (CTE) of the reinforcement element is less than a CTE of the wiring structure.

* * * * *